United States Patent [19]

Li et al.

[11] Patent Number: 5,942,466
[45] Date of Patent: *Aug. 24, 1999

[54] PROCESSING OF (BI,PB) SCCO SUPERCONDUCTOR IN WIRES AND TAPES

[75] Inventors: Qi Li, Waltham; Eric R. Podtburg, Natick; Patrick John Walsh, Newton; William L. Carter, Chelmsford; Gilbert N. Riley, Jr., Marlborough; Martin W. Rupich, Framingham, all of Mass.; Elliott Thompson, Coventry, R.I.; Alexander Otto, Chelmsford, Mass.

[73] Assignee: American Superconductor Corporation, Westborough, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/467,033

[22] Filed: Jun. 6, 1995

Related U.S. Application Data

[63] Continuation-in-part of application No. 08/331,184, Oct. 28, 1994.

[51] Int. Cl.$^6$ ..................................................... H01L 39/24
[52] U.S. Cl. ........................... 505/431; 29/599; 505/433; 505/501
[58] Field of Search .............................. 29/599; 505/430, 505/431, 432, 433, 500, 501

[56] References Cited

U.S. PATENT DOCUMENTS

| | | |
|---|---|---|
| 5,086,034 | 2/1992 | Balachandran et al. . |
| 5,147,848 | 9/1992 | Chang et al. . |
| 5,152,973 | 10/1992 | Spencer . |
| 5,204,316 | 4/1993 | Arendt et al. ......................... 29/599 X |

FOREIGN PATENT DOCUMENTS

| | | |
|---|---|---|
| 0 317 877 A1 | 5/1989 | European Pat. Off. . |
| 0371453 A2 | 6/1990 | European Pat. Off. . |
| 0467238 A1 | 1/1991 | European Pat. Off. . |
| 0431643 A1 | 6/1991 | European Pat. Off. . |
| 0447994 A2 | 9/1991 | European Pat. Off. . |

(List continued on next page.)

OTHER PUBLICATIONS

Balachandran et al., "Reduced–Pressure Calcination of Bismuth–Based Superconductors" Presented at a Poster Session at the Materials Research Society Meeting, Boston, MA (Dec. 3, 1991).

Zhengping et al., "BiPbSrCaCuO Superconductor Prepared by a Three–Step Reaction Process" *Supercond. Sci. Technol.*, 5, 240–246 (1992).

Idemoto et al., "Oxygen Nonstoichiometery of 2223 Phase Bi–Pb–Sr–Ca–Cu–O System Superconducting Oxide" *Physica C*, 181, 171–178 (1991).

*Primary Examiner*—Joseph M. Gorski
*Attorney, Agent, or Firm*—Clark & Elbing LLP

[57] ABSTRACT

A novel process of the production and processing of high quality, high $T_c$ (Bi,Pb)SCCO superconductors starts with fabrication of a precursor article including selected intermediate phases with desired chemical and structural properties. The precursor fabrication includes introducing the reacted mixture having a dominant amount of the tetragonal BSCCO phase into a metal sheath, and sealing the reacted mixture within said sheath, heating the mixture at a second selected processing temperature in an inert atmosphere with a second selected oxygen partial pressure for a second selected time period, the second processing temperature and the second oxygen partial pressure being cooperatively selected to form a dominant amount of an orthorhombic BSCCO phase in the reacted mixture. The sealed sheath is deformed to form an elongated precursor article of a desired texture; and thereafter heated at a third selected processing temperature in an inert atmosphere with a third selected oxygen partial pressure for a third selected time period. The third processing temperature and third oxygen partial pressure are cooperatively selected to convert at least a portion of the orthorhombic BSCCO phase to the final superconducting BSCCO material.

26 Claims, 8 Drawing Sheets

U.S. PATENT DOCUMENTS

| | | |
|---|---|---|
| 0449161 A1 | 10/1991 | European Pat. Off. . |
| 0470595 A1 | 2/1992 | European Pat. Off. . |
| 475315 | 3/1992 | European Pat. Off. . |
| 0496281 A2 | 7/1992 | European Pat. Off. . |
| 0 536 730 A1 | 4/1993 | European Pat. Off. . |
| 551523 | 7/1993 | European Pat. Off. . |
| 290 292 | 5/1991 | Germany . |
| 4214415 | 3/1992 | Japan . |
| WO 92/13649 | 8/1992 | WIPO . |

PROCESSING OF (BI,PB) SCCO SUPERCONDUCTOR IN WIRES AND TAPES

This application is a continuation-in-part application of co-pending application U.S. Ser. No. 08/331,184 filed Oct. 28, 1994 and entitled "Production and Processing of (Bi, Pb)SCCO Superconductors", which is herein incorporated by reference.

BACKGROUND OF THE INVENTION

The present invention relates to the production and processing of high $T_c$ superconducting bismuth-strontium-calcium-copper-oxide materials.

Since the discovery of the copper oxide ceramic superconductors, their physical and chemical properties have been widely studied and described in many publications, too numerous to be listed individually. These materials have superconducting transition temperatures ($T_c$) greater than the boiling temperature (77K) of liquid nitrogen. However, in order to be useful for the majority of applications at 77K or higher, substantially single phase superconducting materials with high critical current densities ($J_c$) are needed. In general, this requires that the grains of the superconductor be crystallographically aligned, or textured, and well sintered together. Several members of the bismuth-strontium-calcium-copper-oxide family (BSCCO), in particular, $Bi_2Sr_2CaCu_2O_8$ (BSCCO 2212) and $Bi_2Sr_2Ca_2Cu_3O_{10}$ (BSCCO 2223) have yielded promising results, particularly when the bismuth is partially substituted by dopants, such as lead ((Bi,Pb)SCCO).

Composites of superconducting materials and metals are often used to obtain better mechanical properties than superconducting materials alone provide. These composites may be prepared in elongated forms such as wires and tapes by a well-known process which includes the three stages of: forming powder of superconductor precursor material pre-cursor powder formation tage); filling a noble metal container, such as a tube, billet or grooved sheet, with the precursor powder and deformation processing one or more filled containers to provide a composite of reduced cross-section including one or more cores of superconductor precursor material in a surrounding noble metal matrix (composite precursor fabrication stage); and subjecting the composite to successive physical deformation and annealing cycles and further thermally processing the composite to form and sinter a core material having the desired superconducting properties (thermomechanical processing). The alignment of precursor grains in the core ("textured" grains) caused by the deformation process facilitates the growth of well-aligned and sintered grains of the desired superconducting material during later thermal processing stages.

The general process, commonly known as "powder-in-tube" or "PIT", is practiced in several variants depending on the starting powders, which may be, for example, metal alloys having same metal content as the desired superconducting core material in the "metallic precursor" or "MPIT" process, or mixtures of powders of the oxide components of the desired superconducting oxide core material or of a powder having the nominal composition of the desired superconducting oxide core material in the "oxide powder" or "OPIT" process. General information about the PIT method described above and processing of the oxide superconductors is provided by Sandhage et al., in JOM, Vol. 43, No. 3 (1991) pages 21 through 25, and the references cited therein.

OPIT precursor powders are prepared by reacting raw powders such as the corresponding oxides, oxalates, carbonates, or nitrates of the metallic elements of the desired superconducting oxide. Because the OPIT precursor powder is formed by chemical reaction, its actual phase composition will depend on the quality and chemical composition of the starting materials and on the processing conditions, such as temperature, time, and atmosphere. Different processing conditions will give rise to different phases or different ratios of phases. If secondary phases, such as calcium plumbate ($Ca_2PbO_4$), are formed in relatively large amounts, they can give rise to undesired effects.

The presence of calcium plumbate, for example, disrupts the deformation induced texturing of the primary phase of the precursor powder, results in gas evolution during thermal processing, leads to growth of certain undesirable alkaline earth cuprate (AEC) phases which do not participate in the conversion of the precursor into the final oxide superconductor, and may induce undesired melting during heat treatments.

In order to avoid undesirable secondary phase formation, precursor powders sometimes are prepared by forming a BSCCO superconductor phase in a separate synthesis step and combining the BSCCO superconductor phase with a second metal oxide. The two powders may be readily reacted in a subsequent thermal processing step into the final oxide superconductor. By preparing the BSCCO superconductor in a separate reaction, it may be possible to avoid inclusion of undesirable secondary phases in the precursor powder.

A typical prior art preparation involves preparing essentially single phase (Bi,Pb)SCCO 2212 in a separate reaction and combining it with an alkaline earth cuprate. In subsequent thermal reactions, the two metal oxides react to form (Bi,Pb)SCCO 2223. The prior art reaction process is less than optimal because combining separate oxide powders necessarily reduces the intimate contact between the reactants (resulting in inhomogeneity), thereby requiring longer reaction times and/or harsher reaction conditions in order to obtain the final product. The slower reaction kinetics results in reduced control over the reaction process.

It is desirable, therefore, to have a method for preparing precursor powders having a controlled phase composition in a single step reaction process. It is further desirable to provide a method of controlling the phase composition of the precursor powder during its preparation and during subsequent thermomechanical processing.

SUMMARY OF THE INVENTION

The present invention provides a means of preparing a precursor powder for the BSCCO superconducting materials, particularly Pb-doped BSCCO materials, with selected primary and secondary phases and of controlling the phase composition of the precursor powder during its preparation and during subsequent thermomechanical processing steps. In general, in one aspect, the invention provides an improved precursor powder for the production of BSCCO superconducting material, and a process for making this precursor powder, while in another aspect it provides an improvement in processing of the precursor powder during the thermomechanical processing of the powder into the desired superconducting material.

In one aspect of the invention, a method for the production and processing of BSCCO superconducting material includes the steps of providing a mixture comprising raw materials of a desired ratio of constituent metallic elements corresponding to a final superconducting BSCCO material, and heating said mixture at a selected temperature in an inert atmosphere with a selected oxygen partial pressure for a selected time period. The processing temperature and the oxygen partial pressure are cooperatively elected to form a dominant amount of an orthorhombic BSCCO phase in he reacted mixture.

By "final BSCCO superconducting material", as that term is used erein, it is meant the chemical composition and solid state structure of the superconducting material after all processing of the precursor is completed. It is typically, though not always, the oxide superconductor phase having the highest $T_c$ or $J_c$.

By "dominant amount" of the orthorhombic BSCCO phase, as that term is used herein, it is meant that the orthorhombic phase is the dominant phase present in the precursor powder, as selected among the members of the homologous BSCCO series of oxide superconductor. A "dominant amount" includes more than 50 vol %, preferably more than 80 vol %, and most preferably, more than 95 vol % of the members of the homologous BSCCO series as the orthorhombic phase.

Reference to the "orthorhombic phase" recognizes the existence of two crystallographic structures for BSCCO superconducting materials, the tetragonal and the orthorhombic structures. The conversion of the tetragonal to the orthorhombic structure corresponds to the formation of an oxygen deficient structure. The conversion occurs simultaneously with the complete incorporation of a substituent having a variable oxidation state, i.e., Pb or Sb, into the BSCCO structure. Since the dopant typically exists in an oxide phase, such as for example, $Ca_2PbO_4$, the conversion from the tetragonal to the orthorhombic does not occur until all the dopant is consumed. Thus the formation of the orthorhombic phase is indicative of the complete reaction of the dopant carrier. The formation of the orthorhombic phase is indicated by the splitting of the XRD 200 and 020 peaks at 33°(2θ).

In a preferred embodiment, the final superconducting material includes a BSCCO-2223 phase. In another preferred embodiment, the final superconducting material includes a (Bi,Pb)SCCO-2223 phase. In another preferred embodiment, the dominant orthorhombic phase includes a BSCCO-2212 phase. In yet another preferred embodiment, the dominant orthorhombic phase includes a doped BSCCO-2212 phase, where the dopant substitutes for bismuth. The dopant may be lead (Pb) or antimony (Sb), and is preferably Pb.

In a preferred embodiment, the processing temperature and the oxygen partial pressure are cooperatively selected to form an alkaline earth cuprate phase, in addition to the dominant orthorhombic BSCCO phase, during the heating step. By "alkaline earth cuprate" or AEC, as that term is used herein, it is meant metal oxide phases including an alkaline earth, such as calcium (Ca) and/or strontium (Sr) and including copper. There may be one or more phases present in the precursor powder. The overall composition of the AEC may vary as the oxidation states of the constituent elements vary and as calcium and strontium substitute for each other. Suitable AECs, include, by way of example only, $(Sr_xCa_{1-y})CuO_2$, $(Sr_xCa_{1-y})_2CuO_3$, $(Sr_xCa_{14-x})Cu_{24}O_{38}$. The AEC phases may also include single metal oxides, such as, by way of example, CuO, CaO and $Cu_2O$.

In another preferred embodiment, the processing temperature and the oxygen partial pressure are cooperatively selected such that the oxygen partial pressure is below a value at which a Ca—Pb—O phase is formed and above a value at which said dominant orthorhombic BSCCO phase decomposes. In yet another preferred embodiment, the heating step includes maintaining the temperature of the mixture in a range of 650° C. to 795° C. and the oxygen partial pressure in a range of $10^{-5}$ atm $O_2$ to 0.04 atm $O_2$, and preferably maintaining the temperature of the mixture in a range of 720° C. to 790° C. and the oxygen partial pressure in a range of $10^{-4}$ to $10^{-2}$ atm $O_2$.

In yet another aspect of the present invention, a (Bi,Pb)—Sr—Ca—Cu—O superconducting material is prepared by providing a mixture of raw materials of a desired ratio of constituent metallic elements corresponding to a final superconducting (Bi,Pb)—Sr—Ca—Cu—O material, and heating the mixture at a selected processing temperature in an inert atmosphere with a selected oxygen partial pressure for a selected time period, wherein the processing temperature and said oxygen partial pressure are cooperatively selected to eliminate, substantially, formation of a Ca—Pb—O phase.

In a preferred embodiment, the processing temperature and oxygen partial pressure are cooperatively selected to form alkaline earth cuprate phases, in addition to eliminating, substantially, formation of a Ca—Pb—O phase. In another preferred embodiment, the processing temperature and the oxygen partial pressure are cooperatively selected such that the oxygen partial pressure is below a value at which a Ca—Pb—O phase is formed. In yet another preferred embodiment, the mixture is maintained at a temperature in a range of 650° C. to 795° C. and an oxygen partial pressure in a range of $10^{-5}$ atm $O_2$ to 0.04 atm $O_2$ during the heating step. In yet another preferred embodiment, the mixture is maintained at a temperature in a range of 720° C. to 790° C. and an oxygen partial pressure in a range of $10^{-4}$ atm $O_2$ to $10^{-2}$ atm $O_2$ during the heating step.

In yet another aspect of the present invention, an elongated BSCCO or (Bi,Pb)—Sr—Ca—Cu—O superconducting article is prepared. A mixture of raw materials of a desired ratio of constituent metallic elements corresponding to a final superconducting BSCCO or (Bi,Pb)SCCO 2223 material is provided.

The mixture is heated at a first selected processing temperature in an inert atmosphere with a first selected oxygen partial pressure for a first selected time period, such that the first processing temperature and the first oxygen partial pressure are cooperatively selected to form a dominant amount of an orthorhombic BSCCO or (Bi,Pb)SCCO 2212 phase in the reacted mixture. The reacted mixture is introduced into a metal sheath, and sealed. The sealed sheath is deformed to form an elongated precursor article of a desired texture. The orthorhombic BSCCO or (Bi,Pb)SCCO 2212 phase is heated after the deforming step at a second selected processing temperature in an inert atmosphere with a second selected oxygen partial pressure for a second selected time period, such that second processing temperature and the second oxygen partial pressure are cooperatively selected to convert at least a portion of the orthorhombic BSCCO or (Bi,Pb)SCCO 2212 phase to the BSCCO or (Bi, Pb)SCCO 2223 superconducting material.

In a preferred embodiment, the first processing temperature and the first oxygen partial pressure are cooperatively selected to form a dominant amount of an alkaline earth cuprate phase, in addition to the dominant orthorhombic (Bi,Pb)SCCO 2212 phase. In another preferred embodiment, the steps deforming and second heating steps are repeated one or more times. In another preferred embodiment, the heating step includes cooperatively selecting the second processing temperature and the second oxygen partial pressure, such that oxygen partial pressure is below a value at which a Ca—Pb—O phase is formed and above a value at which the dominant orthorhombic (Bi,Pb)SCCO 2212 phase decomposes. In yet another preferred embodiment, the heating step includes heating at a temperature in the range of 800° C. to 845° C. and preferably 800° C. to 834° C. and at an oxygen pressure in the range of 0.003 to 0.21 atm $O_2$.

In yet another preferred embodiment, the second heating step includes ramping through a temperature range and an oxygen partial pressure range, such that the temperature and oxygen partial pressure range cooperatively include a value at which a Ca—Pb—O phase is formed and/or a value at which the dominant orthorhombic (Bi,Pb)SCCO 2212 phase decomposes. The ramping is at a rate sufficiently rapid such that the formation of the Ca—Pb—O phase and decomposition of the dominant orthorhombic (Bi,Pb)SCCO 2212 phase is kinetically disfavored. In a preferred embodiment, the ramp rate is greater than 0.1° C./min and preferably is in the range of 0.1 to 100° C./min. In another aspect of the present invention, an elongated BSCCO superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and partial pressure are cooperatively selected to form a dominant amount of certain desired BSCCO precursor phases in the reacted mixture. A composite article is then formed which is comprised of the reacted mixture substantially surrounded by a constraining metal. The article is then heated at a second selected processing temperature in an inert atmosphere with a second selected oxygen partial pressure for a second selected time period. The second processing temperature and the second partial pressure are cooperatively selected to form a dominant amount of an orthorhombic BSCCO phase in the reacted mixture. A texture-inducing deformation is performed on the article to form an elongated precursor article of a desired texture. In a preferred embodiment, the elongated precursor article is then heated at a third selected processing temperature in an inert atmosphere with a third selected oxygen partial pressure for a third selected time period. The third processing temperature and the third oxygen partial pressure are cooperatively selected to convert at least a portion of the orthorhombic BSCCO phase to the final superconducting BSCCO material, characterized in that the final BSCCO material exhibits substantial biaxial alignment.

In another aspect of the present invention, an oxide superconducting composite is provided comprising a dominant amount of a BSCCO 2212 phase substantially surrounded by a constraining metal, characterized in that the BSCCO 2212 phase exhibits substantial biaxial alignment.

In another aspect of the present invention, an oxide superconducting composite is provided comprising a dominant amount of a BSCCO 2223 phase substantially surrounded by a constraining metal, characterized in that the BSCCO 2223 phase exhibits substantial biaxial alignment.

In another aspect of the present invention, an elongated BSCCO superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and first oxygen partial pressure are cooperatively selected to form a dominant amount of a tetragonal BSCCO phase in the reacted mixture. A composite article then is formed comprised of the reacted mixture substantially surrounded by a constraining metal. The article then is heated at a second selected processing temperature in an inert atmosphere with a second selected oxygen partial pressure for a second selected time period. The second processing temperature and second oxygen partial pressure are cooperatively selected to form a dominant amount of an orthorhombic BSCCO phase in the reacted mixture. A texture-inducing deformation is performed on the article to form an elongated precursor article of a desired texture; and the elongated precursor article then is heated at a third selected processing temperature in an inert atmosphere with a third selected oxygen partial pressure for a third selected time period. The third processing temperature and third oxygen partial pressure are cooperatively selected to convert at least a portion of the orthorhombic BSCCO phase to the final superconducting BSCCO material.

In another aspect of the present invention, an elongated BSCCO superconducting article is manufactured by forming a composite article comprised of a dominant amount of a tetragonal BSCCO phase substantially surrounded by a constraining metal and heating the composite article at a first selected processing temperature in an inert atmosphere with a first selected oxygen partial pressure for a first selected time period. The first processing temperature and first oxygen partial pressure are cooperatively selected to form a dominant amount of an orthorhombic BSCCO phase in the precursor oxide powder. A texture-inducing deformation is performed on the composite article to form an elongated precursor article of a desired texture; and the elongated precursor article is heated at a second selected processing temperature in an inert atmosphere with a second selected oxygen partial pressure for a second selected time period. The second processing temperature and second oxygen partial pressure being cooperatively selected to convert at least a portion of the orthorhombic BSCCO phase to the final superconducting BSCCO material.

In another aspect of the present invention, an elongated BSCCO superconducting article is manufactured by heating a composite article comprising a dominant amount of a tetragonal BSCCO phase substantially surrounded by a constraining metal at a first selected processing temperature in an inert atmosphere with a first selected oxygen partial pressure for a first selected time period. The first processing temperature and first oxygen partial pressure are cooperatively selected to form a dominant amount of an orthorhombic BSCCO phase in the precursor oxide powder. A texture-inducing deformation is performed to the composite article to form an elongated composite article of a desired texture; and the elongated composite article is heated at a second selected processing temperature in an inert atmosphere with a second selected oxygen partial pressure for a second selected time period. The second processing temperature and second oxygen partial pressure are cooperatively selected to convert at least a portion of the orthorhombic BSCCO phase to the final superconducting BSCCO material.

In preferred embodiments, during the relevant heating step, the processing temperature and oxygen partial pressure are cooperatively selected to form a dominant orthorhombic BSCCO phase. In another preferred embodiment, the texture-inducing deforming step is an asymmetric deformation such as rolling, pressing extruding or drawing through an aspected die or twisting. By "asymmetric deformation", it is meant any deformation which provides a substantial change in aspect ratio or shear strain in the material. In other preferred embodiments, the forming of the composite article comprises forming the metal constrained tetragonal BSCCO phase into an article of a narrower or of a different cross-sectional geometry;

or grouping a plurality of metal constrained tetragonal BSCCO phase-containing articles and extruding or drawing the plurality of articles into a single article.

In another embodiment of the present invention, the steps of texture-inducing deforming step and final oxide superconductor-forming heating steps are sequentially repeated. In other preferred embodiments, the step of forming a dominant amount of a tetragonal BSCCO phase is carried out at a first temperature in the range of 700–850° C. and an oxygen partial pressure in the range of 0.04 atm to 1 atm. In other preferred embodiments, the step of forming a dominant amount of an orthorhombic BSCCO phase is carried out at a temperature in the range of 650° C. to 795° C. and an oxygen partial pressure in the range of $10^{-5}$ atm $O_2$ to 0.04 atm $O_2$.

The step of heating to form the final oxide superconductor preferably includes cooperatively selecting the relevant processing temperature and oxygen partial pressure, such that oxygen partial pressure is below a value at which a Ca—Pb—O phase is formed and above a value at which dominant orthorhombic (Bi,Pb)SCCO 2212 phase decomposes. It may alternatively preferably include heating at a temperature in the range of 800° C. to 845° C. and at an oxygen pressure in the range of 0.003 to 0.21 atm $O_2$. It may alternatively preferably include heating in a first step in the range of about 810–850° C.; heating in a second step in the range of about 800–840° C.; and heating in a third step in the range of about 730–800° C., said first, second and third heating steps at an oxygen pressure in the range of 0.003 to 0.21 atm $O_2$ It may alternatively preferably include heating at a first temperature in the range of 650° C. to 795° C. and at a first oxygen pressure in the range of 0.0001 to 0.075 atm $O_2$; and heating at a second temperature in the range of 800° C. to 845° C. and at a second oxygen pressure in the range of 0.003 to 0.21 atm $O_2$. It may also alternatively include heating at a first temperature in the range of 650° C. to 795° C. and at a first oxygen pressure in the range of 0.0001 to 0.075 atm $O_2$; and heating in a second step in the range of about 81–850° C.; heating in a third step in the range of about 800–840° C.; and heating in a fourth step in the range of about 730–800° C., said second, third and fourth heating steps at an oxygen pressure in the range of 0.003 to 0.21 atm $O_2$ In another preferred embodiment, heating to form the final oxide superconductor comprises ramping through a temperature range and an oxygen partial pressure range, the temperature and oxygen partial pressure range cooperatively including a value at which a Ca—Pb—O phase is formed and/or a value at which the dominant orthorhombic (Bi,Pb) SCCO phase decomposes, the ramping at a rate sufficiently rapid such that the formation of the Ca—Pb—O phase and decomposition of the dominant orthorhombic (Bi,Pb)SCCO phase is kinetically disfavored. The ramp rate may be greater than 0.1° C./min. The ramp rate may be in the range of 0.1 to 100° C./min.

In preferred embodiments, the final oxide superconductor comprises (Bi,Pb)SCCO 2223, the tetragonal BSCCO phase comprises tetragonal (Bi,Pb)SCCO 2212 and the orthorhombic BSCCO phase comprises orthorhombic (Bi,Pb)SCCO 2212. In other preferred embodiments, the final oxide superconductor comprises BSCCO 2223, the tetragonal BSCCO phase comprises tetragonal BSCCO 2212 and the orthorhombic BSCCO phase comprises orthorhombic BSCCO 2212.

In another aspect of the present invention, a method of manufacture of an elongated BSCCO superconducting article includes heating a composite article comprising a dominant amount of an orthorhombic BSCCO phase substantially surrounded by a constraining metal at a first selected processing temperature in an inert atmosphere with a first selected oxygen partial pressure for a first selected time period. The first processing temperature and first oxygen partial pressure favor the presence of the orthorhombic BSCCO phase in the composite article. Then a texture-induced deformation is performed on the composite article to form an elongated composite article of a desired texture; and the elongated composite article is heated at a second selected processing temperature in an inert atmosphere with a second selected oxygen partial pressure for a second selected time period. The second processing temperature and second oxygen partial pressure being cooperatively selected to convert at least a portion of the orthorhombic BSCCO phase to the final superconducting BSCCO material.

The method of the present invention provides a precursor powder that substantially is free of undesirably secondary phases and which can be processed according to the above method of the invention to obtain a superconducting article having superior electrical properties.

DETAILED DESCRIPTION OF THE INVENTION

Figure 1:
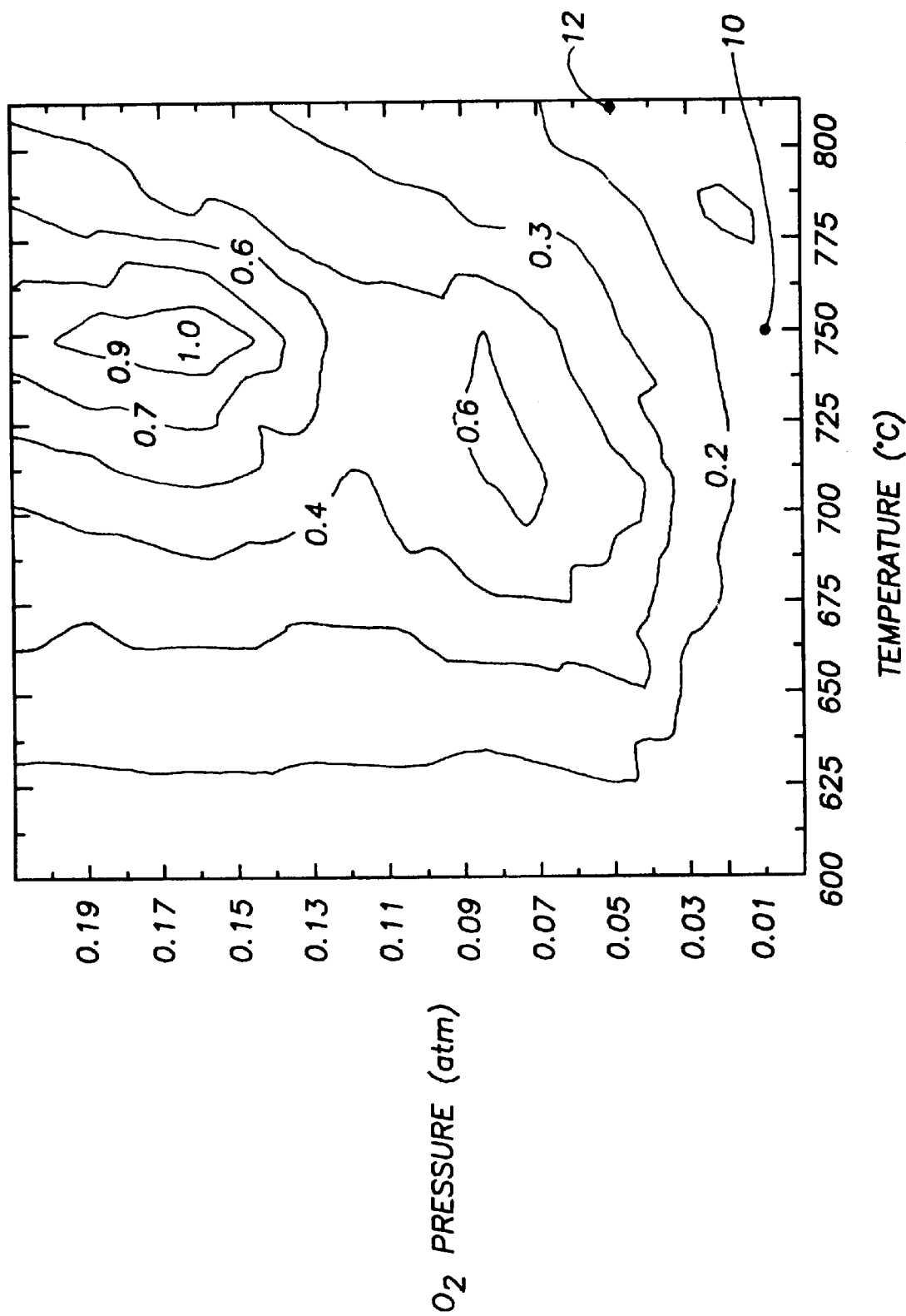
FIG. 1 depicts a three dimensional plot of relative $Ca_2PbO_4$ formation in an orthorhombic (Bi,Pb)SCCO 2212 precursor powder at different temperature and $P(O_2)$.

The present invention provides a precursor powder, useful in the preparation of BCSSO superconducting materials and composites, which include a dominant amount of an orthorhombic BSCCO phase and, optionally, an alkaline earth cuprate (AEC). The method of the present invention provides an intimate mixture of the two phases (orthorhombic BSCCO phase and AEC) which can not be obtained by prior art methods of mixing individual sources of the two materials.

The method of the present invention includes an optimized process for preparing a precursor powder including a dominant amount of an orthorhombic BSCCO phase, and an optimized thermal processing method that maintains the selected phase composition of the precursor powder, reduces the formation of undesirable secondary phases during conversion of the powder into the final superconducting material and enhances the formation of substantially single phase, highly textured forms of the final superconducting material.

According to the method of the invention, a process for preparing a precursor powder is described, in which control of processing conditions, such as temperature and oxygen partial pressure, provide a precursor powder which contains a dominant amount of an orthorhombic BSCCO phase. The orthorhombic BSCCO phase typically may include BSCCO 2212. It may also include a doped BSCCO 2212 such as, by way of example only, (Bi,Pb)SCCO 2212 or (Bi,Sb)SCCO. The addition of a dopant to the BSCCO phase is believed to promote the conversion of the tetragonal BSCCO phase to the more desirable orthorhombic BSCCO 2212 phase under the reaction conditions of the present invention.

According to the method of the present invention, undesirable secondary phases are also minimized. By "undesirable secondary phase", as that term is used herein, it is meant phases in the precursor powder which do not promote or which hinder the conversion of the precursor powder into the final BSCCO superconducting material. "Undesirable" secondary phases are contrasted to "desirable" secondary phases, the latter of which are necessary for the conversion of the precursor into the final superconducting material. Suitable desirable secondary phases include alkaline earth cuprates and/or copper oxides which react with the orthorhombic BSCCO phase to form a higher order family member of the BSCCO homologous series of superconducting oxides. "Undesirable secondary phases" may include unreacted metal oxides, such as alkaline earth bismuthates or alkaline earth plumbate, or lower members of the homologous series of which the final BSCCO superconductor is a member, for example, BSCCO 2201. In the (Bi,Pb)BSCCO system, the presence of a Ca—Pb—O secondary phase, i.e., $Ca_2PbO_4$, is undesirable because it can produce large unwanted secondary phases which are unproductive in the formation of the final superconductor phase (by reaction of the BSCCO phase without incorporation of lead into the product) and thereby reduce the rate of formation of (Bi,Pb)SCCO 2223.

According to the method of the invention, a raw powder mixture is produced by mixing appropriate amounts of raw powder in a stoichiometry suitable for production of a desired final phase. Suitable raw powders include, but are not limited to, oxides, carbonates, oxalates, alkoxides or nitrates of Bi, Sr, Ca and Cu, and optionally Pb or Sb. After thoroughly mixing the raw materials, the mixture is subjected to multiple heating and grinding steps in order to obtain a uniform mixture of the metallic elements, reduce the particle size and eliminate by-products such as oxides of nitrogen or carbon. Depending on the starting material and the particle size, there are usually one to four initial heating and grinding steps. Typically, the raw powders are heated at a temperature in the range of 350° C. to 800° C., in air or oxygen atmosphere, followed grinding of the powder to a small particle size. Alloying of the constituent metallic elements of the final oxide superconductor is also contemplated within the scope of the present invention.

Thereafter, the raw powder mixture is reacted to form the precursor powder of the present invention, which includes a dominant amount of an orthorhombic BSCCO phase. Processing temperature and oxygen partial pressure are selected such that the formation of an orthorhombic BSCCO phase (among the other possible BSCCO phases) will dominate. It is, of course, contemplated that secondary phases necessary for the conversion of the orthorhombic BSCCO phase into the final superconducting phase may be present in the precursor phase.

According to the method of the invention, the raw powder may be heated to a processing temperature, $T_p$, in the range of 650° C. to 795° C. in a controlled atmosphere of an inert gas and a selected oxygen partial pressure, $P(O_2)$, between $10^{-5}$ atm $O_2$ and 0.04 atm $O_2$. Suitable inert gases include, by way of example only, nitrogen and argon. The temperature may be increased at a ramp rate between 0.5° C. per minute and 200° C. per minute up to the processing temperature, $T_p$, and the mixture may be kept at $T_p$ for a period of 0.1 to 60 hours.

The appropriate values for $T_p$ and $P(O_2)$ may be selected by monitoring the effect of processing conditions by XRD. The presence of the orthorhombic structure is indicated by the splitting of the XRD peak at 33°(2θ). In the related tetragonal structure, the XRD 200 and 020 peaks at 33°(2θ) appears as a singlet. These differences in the x-ray diffraction pattern reflect the real structural differences in the two phases. The two phases further may be distinguished by comparison of their lattice parameters, where there is a decrease in the c-axis in the orthorhombic structure as compared to the tetragonal structure. Furthermore, $P(O_2)$ and $T_p$ control the relative formation of metal oxides secondary phase, including $(Sr_xCa_{1-y})CuO_z$, $(Sr_xCa_{1-x})_2CuO_3$, CuO, CaO, and $Cu_2O$.

For those systems which include lead (Pb), the $O_2$ partial pressure is maintained below a $P(O_2)$ value at which the $Ca_2PbO_4$ phase is formed and bove a $P(O_2)$ value at which the (Bi,Pb)SCCO 2212 phase decomposes by eduction of $Cu^{2+}$ to $Cu^{1+}$. By operating in a processing regime which is racketed by a lower $P(O_2)$ defining the phase stability region of (Bi,Pb)SCCO 2212 and a higher $P(O_2)$ defining a region below which $Ca_2PbO_4$ will not form, phase composition of the precursor powder can be controlled and optimized.

The appropriate values of $T_p$ and $P(O_2)$ may be selected based on the diagram shown in FIG. 1, so that substantially no $Ca_2PbO_4$ is formed in the precursor powder mixture. The diagram displays a dependence of the relative amount of the $Ca_2PbO_4$ phase on the values of $T_p$ and $P(O_2)$ with relative $Ca_2PbO_4$ formation denoted by topical lines ranging from 0 (no $Ca_2PbO_4$ formation) to 1.0 (exclusive $Ca_2PbO_4$ formation). A higher $T_p$ value permits a higher $P(O_2)$ value without forming $Ca_2PbO_4$. For example, only insignificant amounts of $Ca_2PbO_4$ are formed under reaction conditions of 750° C. and 0.01 atm oxygen (indicated by point 10 in FIG. 1), whereas at the reaction temperature of 810° C., no significant amount of $Ca_2PbO_4$ is formed at oxygen pressures as high as 0.05 atm (indicated by point 12 in FIG. 1). Also, at very low $T_p$ (<600° C.), the formation of $Ca_2PbO_4$ is thermodynamically disfavored over a wide range of $PO_2$ (0.0001–0.21 atm). The region of the pressure-temperature diagram in which $Ca_2PO_4$ formation is disfavored and the orthorhombic BSCCO phase is favored is denoted the "orthorhombic phase stability region".

The dominant amount of orthorhombic phase advantageously includes more than 50 percent by volume (% vol), preferably more than 80% vol and most preferably more than 95% vol of the BSCCO phase in the orthorhombic phase. Typically, the volume fraction of orthorhombic phase will be either greater than 95% (the detection limit of XRD) or it will not be present at all because the dopant carrier oxide phase will act as an oxygen buffer, thereby keeping the effective $P(O_2)$ low and preventing phase conversion from tetragonal to orthorhombic. Once the secondary phase containing the dopant has been eliminated, substantially complete conversion to the orthorhombic phase occurs.

The volume fraction of the BSCCO phase having the orthorhombic structure may be determined readily by XRD analysis. The ratio of the intensity of the single peak at 33°(2θ) to the split peak at 33°(2θ) will show the relative amounts of the two phases. Further, in instances, where lead is present, the relative amount of the tetragonal phase may be determined by taking a ratio of the peak at 17.5°(2θ), corresponding to $Ca_2PbO_4$, to the single peak at 330(2θ), corresponding to the orthorhombic (Bi,Pb)BSCCO phase. In the case where a dopant other than lead is used, peaks unique to the secondary phase incorporating that dopant may be used.

The mixture of the primary (Bi,Pb)SCCO 2212 phase and the AEC phases forms a precursor powder which may be used for production of (Bi,Pb)SCCO 2223 or 2212 superconducting wires and tapes using the OPIT method. In the composite precursor fabrication stage of the PIT process, a superconducting composite precursor is formed by packing the precursor powder into a sheath comprising a noble metal layer, reducing the cross-section of the composite by one or more reduction passes, optionally rebundling, and again reducing the composite cross-section.

In accordance with the PIT method, the precursor powder is packed into a silver sheath to form a billet. The billet is extruded to a diameter of about ⅓ of the original diameter and then narrowed with multiple die passes. A monofilamentary tape is fabricated by further extrusion and/or drawing of the billet to a wire, and then rolling the wire, for example, to a 0.006"×0.100" tape. Alternatively, a multifilamentary tape may be fabricated by multiple die passes through hexagonally shaped dies of varying sizes to form a silver sheathed (Bi,Pb)SCCO hexagonal wire. Several of the hexagonal wires may bundled together and drawn through a round die to form a multi-filamentary round wire. The round wire may then be rolled, for example, to form a multi-filamentary silver and (Bi,Pb)SCCO composite precursor tape of 0.009"×0.100".

The composite may be textured using by one or more texturing deformation steps. The "texturing deformation" steps induce texturing of the selected orthorhombic phase of the precursor powder contained in the composite. Texture-inducing deformation typically are asymmetric deformation by which it is meant any deformation which provides a substantial change in aspect ratio or a shear strain in the material, for example, extruding through an aspected die, twisting, rolling or pressing. Throughout the deformation steps, intermediate annealing steps may be performed. The anneal steps are advantageously carried out at temperatures and under oxygen partial pressures which prevent decomposition of the orthorhombic BSCCO phase or formation of $Ca_2PbO_4$ (See, FIG. 1).

The composite fabrication method of the present invention envisions several mechanical deformation iterations. The strain applied during the deformation improves the grain alignment for each iteration. The rolling process may be replaced any asymmetric texturing process. Thermal annealing may be used after any significant mechanical deformation or reshaping of the superconducting composite for improvement of mechanical properties. Applicants have discovered that annealing conditions used in the prior art typically convert the orthorhombic BSCCO phase into the tetragonal phase with the concomitant formation of $Ca_2PbO_4$. This occurs under prior art treatments, even when the precursor powder is originally substantially free of $Ca_2PbO_4$ (by virtue of mixing of separate powders). Advantageously, the anneal of the present invention may be performed at processing conditions (T, $P(O_2)$) selected to prevent the conversion of the orthorhombic 2212 phase to the tetragonal 2212 phase in order to preserve the advantages of the selected phases of the starting precursor powder, i.e., in the orthorhombic BSCCO phase stability region of the pressure-temperature diagram.

Figure 2:
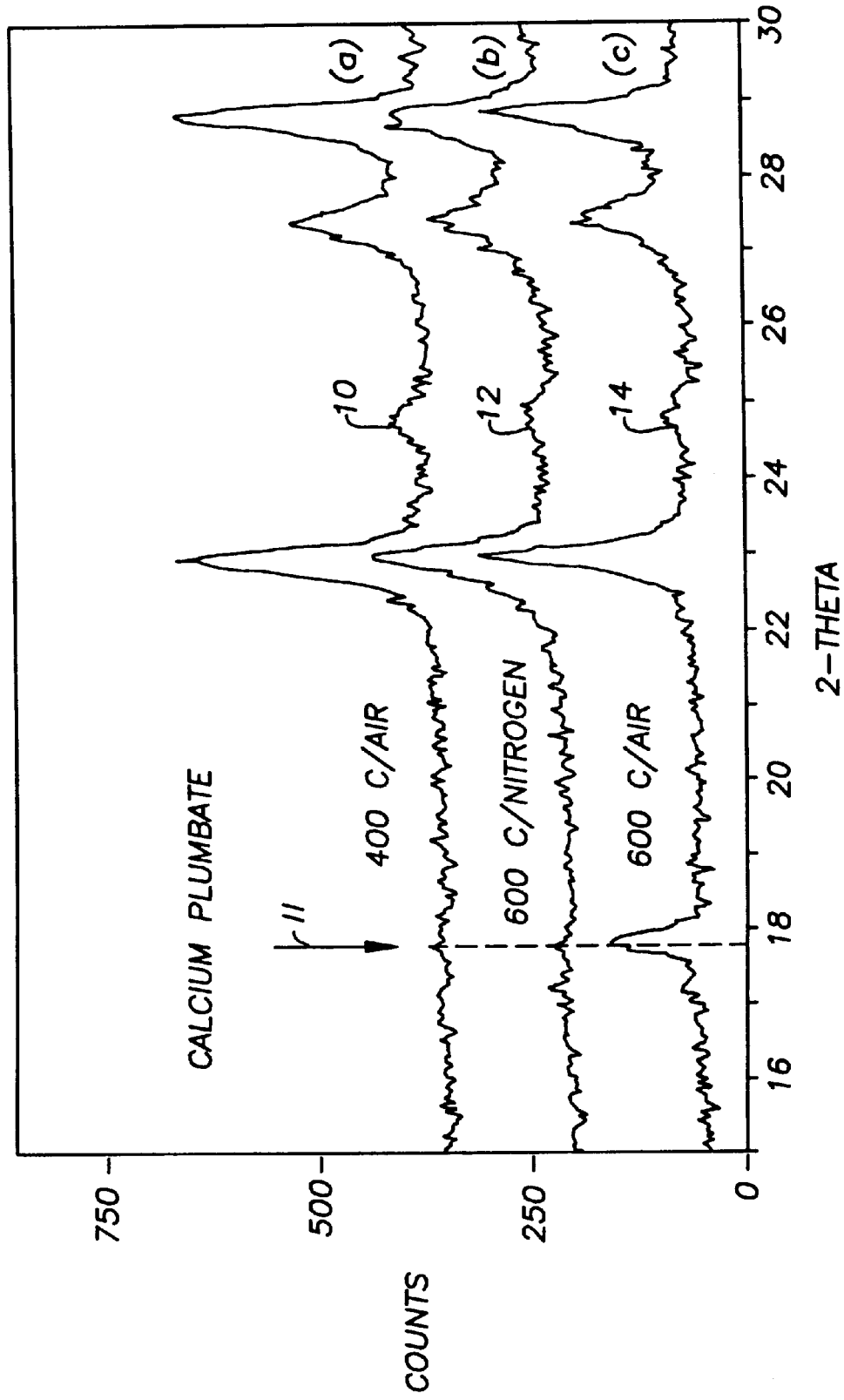
FIG. 2 depicts the x-ray diffraction (XRD) patterns of deformed precursor powder composite tapes fabricated by the OPIT method in which the tape was subjected to anneal (a) at 400° C. in air; (b) at 600° C. in nitrogen, and (c) at 600° C. in air.

FIG. 2 illustrates how annealing steps typically involved in the deformation process can alter the phase composition of the precursor powder. Three precursor composite tapes were prepared from a precursor powder containing a predominant orthorhombic (Bi,Pb)SCCO 2212 phase and secondary AEC phases. The three tapes were annealed at different temperatures in nitrogen (<$10^{-5}$ atm $O_2$) or in air (0.21 atm $O_2$) and the effect of the anneal conditions on the tape composition was observed. The first tape, annealed at 400° C. in air for one hour, showed no discernible formation of tetragonal (Bi,Pb)BSCCO 2212, as indicated by the absence of a single XRD peak at 33°(2θ) (not shown) and the absence of a $Ca_2PbO_4$ XRD peak at 17.8°(2θ) in curve 10 of FIG. 2. Arrow 11 indicates the anticipated location of $Ca_2PbO_4$ peak. The second tape, annealed at 600° C. in nitrogen for one hour, also showed no discernible formation of tetragonal (Bi,Pb)BSCCO 2212 or $Ca_2PbO_4$, as evidenced by XRD in curve 12. This is in agreement with the data shown in FIG. 1. However, the third tape, annealed at 600° C. in air, formed tetragonal (Bi,Pb)BSCCO 2212 and $Ca_2PbO_4$, as evidenced by the presence of a peak at 17.8° (2θ) in curve 14, which is a signature of $Ca_2PbO_4$.

Figure 3:
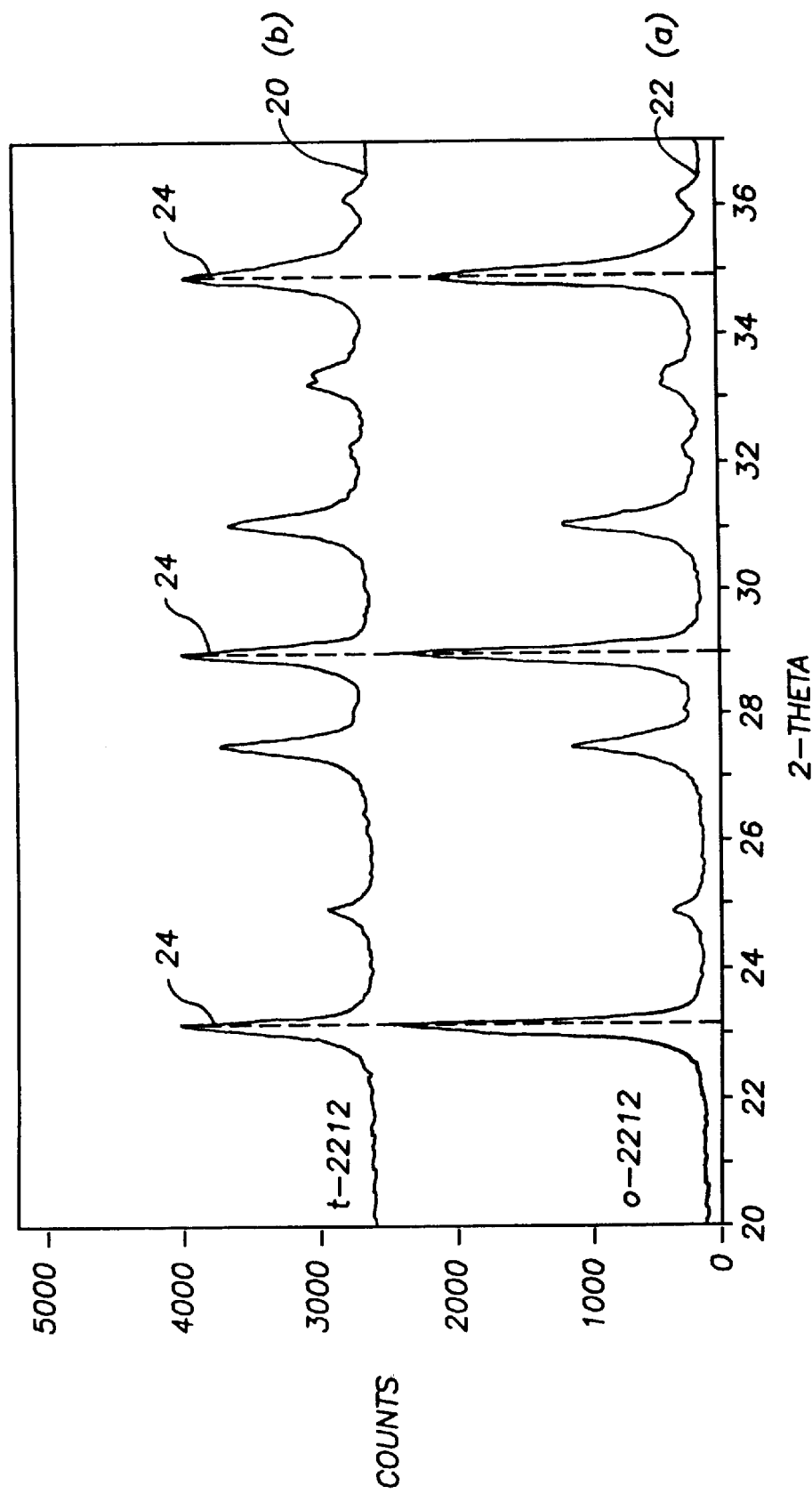
FIG. 3 depicts the X-ray diffraction (XRD) patterns of the deformed precursor powder composite tapes fabricated by the OPIT method using an identical deformation process for composites containing (a) a predominant orthorhombic (Bi, Pb)SCCO 2212 phase, secondary AEC phases and no $Ca_2PbO_4$ phase; and (b) a predominant tetragonal BSCCO 2212 phase, secondary AEC phases, and a $Ca_2PbO_4$ phase.

The effect of different precursor phases on the deformation properties of the composite precursor was studied with two mono-filamentary tapes, fabricated by the OPIT method using an identical deformation process for composites containing two different precursor powders. The first tape included a precursor powder with a predominant orthorhombic (Bi,Pb)SCCO 2212 phase, secondary AEC phases and no $Ca_2PbO_4$ phase. The second tape included a precursor powder with a predominant tetragonal BSCCO 2212 phase, secondary AEC phases, and a $Ca_2PbO_4$ phase. FIG. 3 depicts the XRD patterns of the deformed precursor powder composite tapes. Curve 20 represents the XRD pattern for the tape containing tetragonal (Bi,Pb)SCCO 2212 and curve 22 represents the XRD pattern for the tape containing orthorhombic (Bi,Pb)SCCO 2212. The degree of texturing of the selected primary phase (either tetragonal or orthorhombic (Bi,Pb)SCCO 2212) is indicated by the relative intensities of the labeled peaks 24 compared to the intensities of the remaining peaks of the 2212 phase. The higher the ratio, the larger is the degree of texture. Although the two tapes were subjected to identical deformation processing steps, the orthorhombic (Bi,Pb)SCCO 2212 phase undergoes higher texturing.

The effect of different precursor phases on the properties of the composite precursor was studied by measuring the microhardness in the center of the deformed precursor tape. A tape including a precursor powder with a dominant amount of orthorhombic (Bi,Pb)SCCO 2212 phase, secondary AEC phases and no $Ca_2PbO_4$ phase had a microhardness value of about 150 KHN. A tape including a precursor powder with a dominant amount of tetragonal BSCCO 2212 phase, secondary AEC phases, and a $Ca_2PbO_4$ phase had a microhardness of about 95 KHN. Microhardness reflects the intrinsic hardness of the phase, the porosity of the powder, the texturing, and the intergranular coupling. Thus, the tape made from the orthorhombic (Bi,Pb)SCCO 2212 phase is expected to show more rapid conversion to the final 2223 phase while retaining a higher degree of texture and grain density.

Besides the thermal annealing processes associated with the deformation processes, any thermal processing of the tape can result in changes in the phase content of the precursor powder. Thus it is desirable to control the selected phase content of the precursor powder in the composite by cooperatively selecting the oxygen partial pressure and the temperature of any heating process such that the oxidation state of the constituent elements of the selected primary phase are not changed.

The thermal heating process of the present invention involves heating the deformed composite to a reaction temperature, $T_f$, where the final superconducting phase, such as BSCCO 2223, is formed. In order to heat the composite to the desired $T_f$ without altering the selected phase content of the precursor powder, it is necessary to cooperatively maintain the temperature, oxygen partial pressure and reaction time at reaction conditions that will effect conversion of the precursor to the final superconducting oxide without effecting the decomposition of the orthorhombic BSCCO phase. (See FIG. 1.) According to the method of the invention, the precursor powders may be heated at a temperature in the range of 800° C. to 845° C., and more preferably 800° C. to 834° C., at an oxygen pressure in the range of 0.003 atm to 0.21 atm in order to convert the precursor to the final superconductor phase without adversely affecting phase composition of the precursor during the heat treatment.

Typically, the tape is heated to a temperature in the range of 650° C. to 795° C. in an inert atmosphere with a reduced $O_2$ partial pressure between 0.0001 atm and 0.075 atm. The selected ramp rate is in the range of 0.1° C. per minute to 50° C. per minute. The temperature and oxygen partial pressure ranges are selected to prevent subjecting the composite to conditions moving through a regime where the orthorhombic BSCCO phase is thermodynamically unstable (again, see FIG. 1). It is also within the scope of the invention to ramp the composite through temperature and oxygen partial pressure ranges at which the formation of $Ca_2PbO_4$ is thermodynamically favored and the orthorhombic BSCCO phase is thermodynamically unstable, but at a ramp rate (change in temperature and oxygen pressure with time) such that $Ca_2PbO_4$ is kinetically disfavored (i.e., the composite is not subjected to such conditions for enough time to form $Ca_2PbO_4$).

Once the temperature is sufficiently high, the partial pressure of $O_2$ may be continuously or abruptly increased to a higher value, in the range of 0.01 atm $O_2$ to 0.21 atm $O_2$, used for the (Bi, Pb)SCCO 2223 formation. This oxygen partial pressure is suitable for the conversion of the precursor to the final oxide superconductor, yet will not destabilize the orthorhombic phase at temperatures above 790° C. The selected conversion temperature, $T_f$, in the range of 790° C. to 845° C. may be reached at a ramp rate in the range of 0.5° C. per minute to 10° C. per minute. The tape is maintained at $T_f$ for about 1 to 60 hours to form the desired 2223 phase. Then, the superconducting tape is cooled to room temperature.

Figure 4:
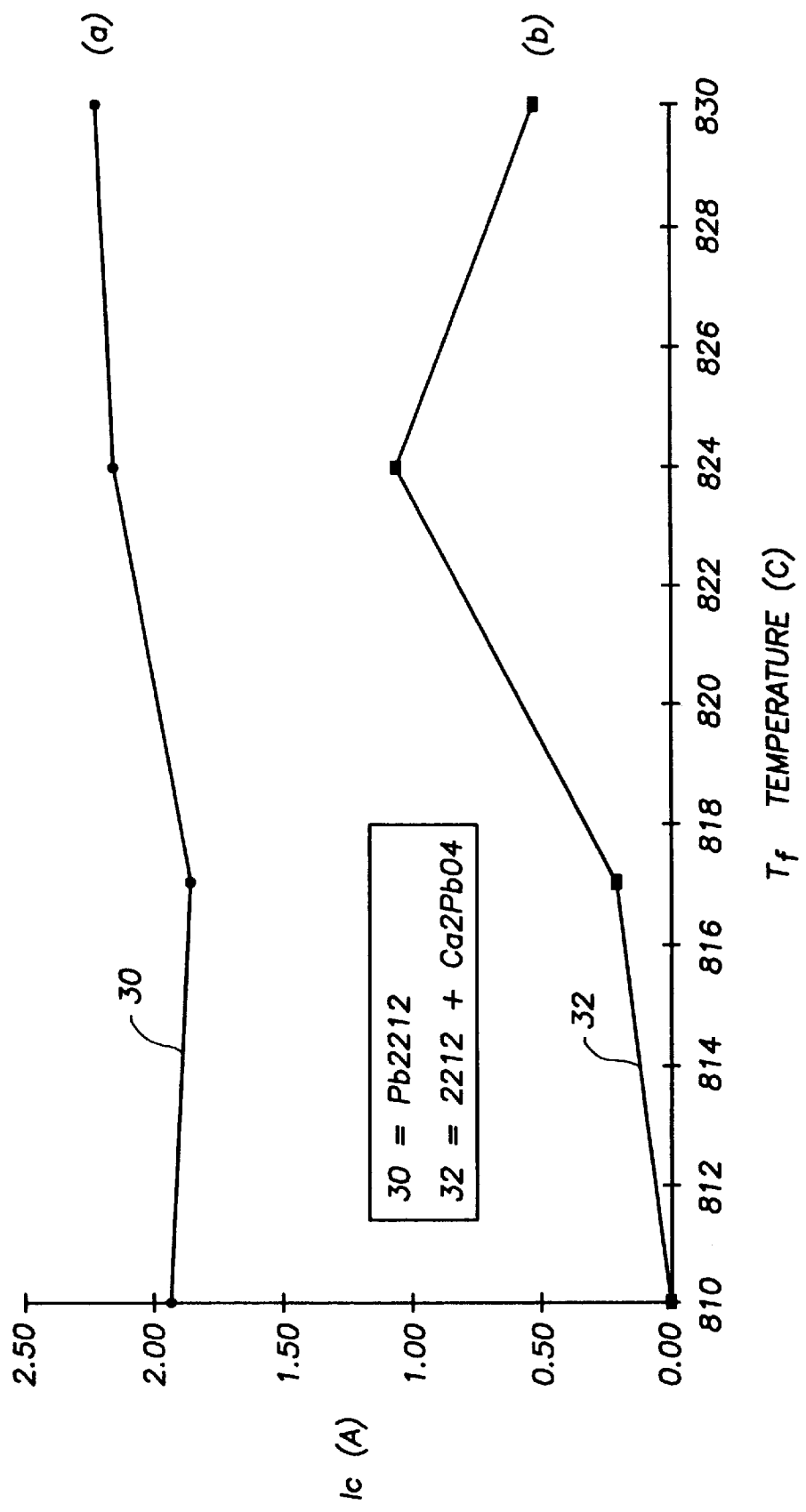
FIG. 4 depicts the dependence of the critical current IC on the thermal reaction temperature, $T_f$, for monofilament (Bi, Pb)SCCO 2223 tapes fabricated from (a) precursor powders with a predomin orthorhombic (Bi,Pb)SCCO 2212 phase, secondary AEC phases and no $Ca_2PbO_4$ phase and (b) precursor powders with a predominant tetragonal BSCCO 2212 phase, secondary AEC phases, and a $Ca_2PbO_4$ phase.

The effect of phase composition of the precursor powder on the critical current $I_c$ of the final superconductor article was studied. Mono-filamentary tapes were fabricated by the OPIT method using an identical deformation process which contained either a precursor powder with a predominant orthorhombic (Bi,Pb)SCCO 2212 phase, secondary AEC phases and no $Ca_2PbO_4$ phase, or a precursor powder with a predominant tetragonal BSCCO 2212 phase, secondary AEC phases, and a $Ca_2PbO_4$ phase. The precursor powder composite tapes were thermally converted into the final superconductor (Bi,Pb) SCCO 2112) at process temperatures in the range of 810° C. to 830° C. in an environment containing a oxygen partial pressure of 0.075 atm. Critical current of the resultant tapes were determined and are depicted as a plot of critical current $I_c$ v. processing temperature in FIG. 4. Curve 30 represents the critical current of tapes processed from precursor powders containing the orthorhombic (Bi,Pb)SCCO 2212 phase. Curve 32 represents the critical current of tapes processed from precursor powders containing the tetragonal (Bi,Pb)SCCO 2212 phase. The critical current of tapes represented by curve 30 (orthorhombic (Bi,Pb)SCCO 2212) is superior to that of tapes processed from tetragonal (Bi,Pb)SCCO 2212 phase (curve 32) at all temperatures.

Also noteworthy is that precursor powders containing $Ca_2PbO_4$ (curve 32) have a narrower optimal processing temperature range, centered about 824° C. at the specified $P_{O2}$, than the precursor powder devoid of $Ca_2PbO_4$ (curve 30). The orthorhombic phase of (Bi,Pb)SCCO 2212 represents substantially complete doping of lead into the BSCCO solid state structure with the concomitant conversion of the lead-free tetragonal phase into the orthorhombic phase. The lead-doped orthorhombic phase readily converts to the final superconductor, (Bi,Pb)SCCO 2223 to give a high quality superconductor over a large temperature range (see FIG. 4, curve 30). In comparison, the lead-free tetragonal BSCCO phase does not convert readily into (Bi,Pb)SCCO 2223, in particular, because it must first dope lead into the BSCCO solid state structure. Doping only occurs around the temperature centered at 824° C. at the specified $P(O_2)$.

Additional thermomechanical treatment processes can be employed to more fully convert the composite to the desired final, highly textured superconducting phase, preferably BSCCO 2223. This additional thermomechanical processing may be carried out by any conventional method, such as for example those described in Gao, Sandhage, and U.S. patent application Ser. No. 08/041,822 filed Apr. 1, 1993, entitled "Improved Processing for Oxide Superconductors," and 08/198,912 filed February 17, 1994, entitled "Improved Processing of Oxide Superconductors", both of which are hereby incorporated by reference as if fully set forth herein.

It has been observed that the tetragonal phase of BSCCO 2212 is wellsuited for the initial formation of multifilamentary articles by extrusion or drawing processes, which are usually symmetric forms of deformation. It is hypothesized that this is so because the tetragonal phase, having identical a and b axes, responds better to more symmetric forms of deformation and/or because the packing density of the tetragonal phase of BSCCO 2212 is greater than the corresponding orthorhombic phase. The tetragonal phase therefore packs well into the metallic tubes used in the OPIT process to form more homogeneously and densely packed powders, which can then be further densified upon extrusion or drawing.

The orthorhombic phase of BSCCO 2212, on the other hand, undergoes texturing to a much greater extent than the corresponding tetragonal phase. The orthorhombic phase responds better to the asymmetric deformation required for deformation-induced texturing resulting in a denser, less porous oxide grain structure. (Compare, for example, the XRD patterns for as-rolled tetragonal BSCCO 2212 tape and as-rolled orthorhombic 2212 tapes in FIG. 3.) For example, after an identical rolling deformation step, a multifilamentary article including the orthorhombic 2212 phase is harder than a multifilamentary article including the tetragonal phase. The relative hardness of the precursor oxide article reflects the porosity of the oxide powder within the filament, the degree of texturing and intergranular coupling. Thus, it is expected that the harder orthorhombic phase would convert more readily into the 2223 phase while retaining the higher degree of texture and density.

The solid state crystal structure of orthorhombic BSCCO phase also makes it well-suited to biaxial alignment because the a axis is not equal in length to the b axis. Therefore, texture-induced deformation which enhances c axis alignment will also enhance b axis alignment. Improvements in critical current density has been associated with the alignment of the b axis. The tetragonal BSCCO phase, in comparison, has equivalent a and b axes and therefore can exhibit no preferential alignment of the two axes.

By biaxial alignment of the orthorhombic BSCCO 2212 phase, the orientation of the oxide in the composite article is fully defined. That is, by alignment of the b and c axes, the a axis is necessarily also aligned. It is expected that the degree of bi-axial alignment will increase with increasing shear strain applied to the article. The actual degree of alignment will be a function of the particular asymmetric deformation system applied.

The degree of alignment may be readily measured using standard analytical techniques, for example, x-ray diffraction pole figures. Pole figures measure the variation in alignment of a particular diffraction peak. The greater the degree of biaxial alignment, the higher and sharper the peaks in the figure. The higher and sharper peaks associated with biaxial texture are believed to be associated with higher $J_c$, which would be consistent with observations of other superconducting oxides, and the higher $J_c$'s observed in orthorhombic BSCCO samples made in accordance with the invention (see Examples).

In view of the foregoing, a preferred embodiment of the invention includes forming a composite article using a tetragonal phase 2212 oxide precursor powder. Prior to the texture-inducing deformation operation, the article is subjected to a heat treatment which favors conversion of the tetragonal BSCCO phase into the orthorhombic BSCCO phase. Thereafter, the multifilamentary article is textured by deformation and processed into a BSCCO 2223 oxide superconductor article. Selection of appropriate processing conditions, for example as described in Luo et al., "Kinetics and Mechanism of the $(Bi,Pb)_2Sr_2Ca_2Cu_3O_{10}$ Formation Reaction in Silver-Sheathed Wires," *Applied Superconductivity*, Vol. 1, No. 1/2, pp. 101–107 (1993), will allow the BSCCO 2223 to substantially inherit the texture, whether orthorhombic or tetragonal, of its 2212 precursor phase. Because biaxial alignment can be induced in the orthorhombic phase there is a significant advantage to maintaining this phase in a final 2223 superconducting article. The method of the invention makes use of the advantages of the orthorhombic and tetragonal phases, by using the particular phase most suited to the operation to be performed.

All the factors discussed above with regard to the conditions amenable to the preparation of orthorhombic and tetragonal BSCCO phase powders are applicable to phase formation of these orthorhombic and tetragonal BSCCO phases within the composite article. The composite article may be of any shape or form. It is typically in tape or wire form as a BSCCO powder constrained by a metal. The metal is typically a noble metal or an alloy substantially comprising a noble metal. A noble metal is substantially inert to oxidation under conditions used in high temperature superconductor manufacture.

Further, it appears that oxide superconductor articles which have been subjected to the heat treatment of the invention after forming the composite article (powder packing and extrusion of the article), but before texturing deformation, exhibit improved electrical properties. It has also been observed that composite articles which have been prepared from precursor powders having a dominant orthorhombic BSCCO phase benefit from a heat treatment before the texture-inducing deformation operation. The heat treatment may be carried out under conditions that favor the formation of the orthorhombic BSCCO phase. The heat treatment is not necessarily for the purpose of forming the orthorhombic phase (since a dominant amount of the orthorhombic phase already is present). The heat treatment apparently relieves strain energy introduced into the article by previous wire formation operations, i.e., wire drawing and/or extrusion. Wires which were pressed or rolled after receiving the heat treatment of the invention exhibit significantly reduced cracking, as compared to wires which were deformed without any such heat treatment. It is possible that such phase modification releases the previous deformation-induced defects, e.g. dislocation, in addition to obtaining a homogeneous phase conversion.

Figure 5:
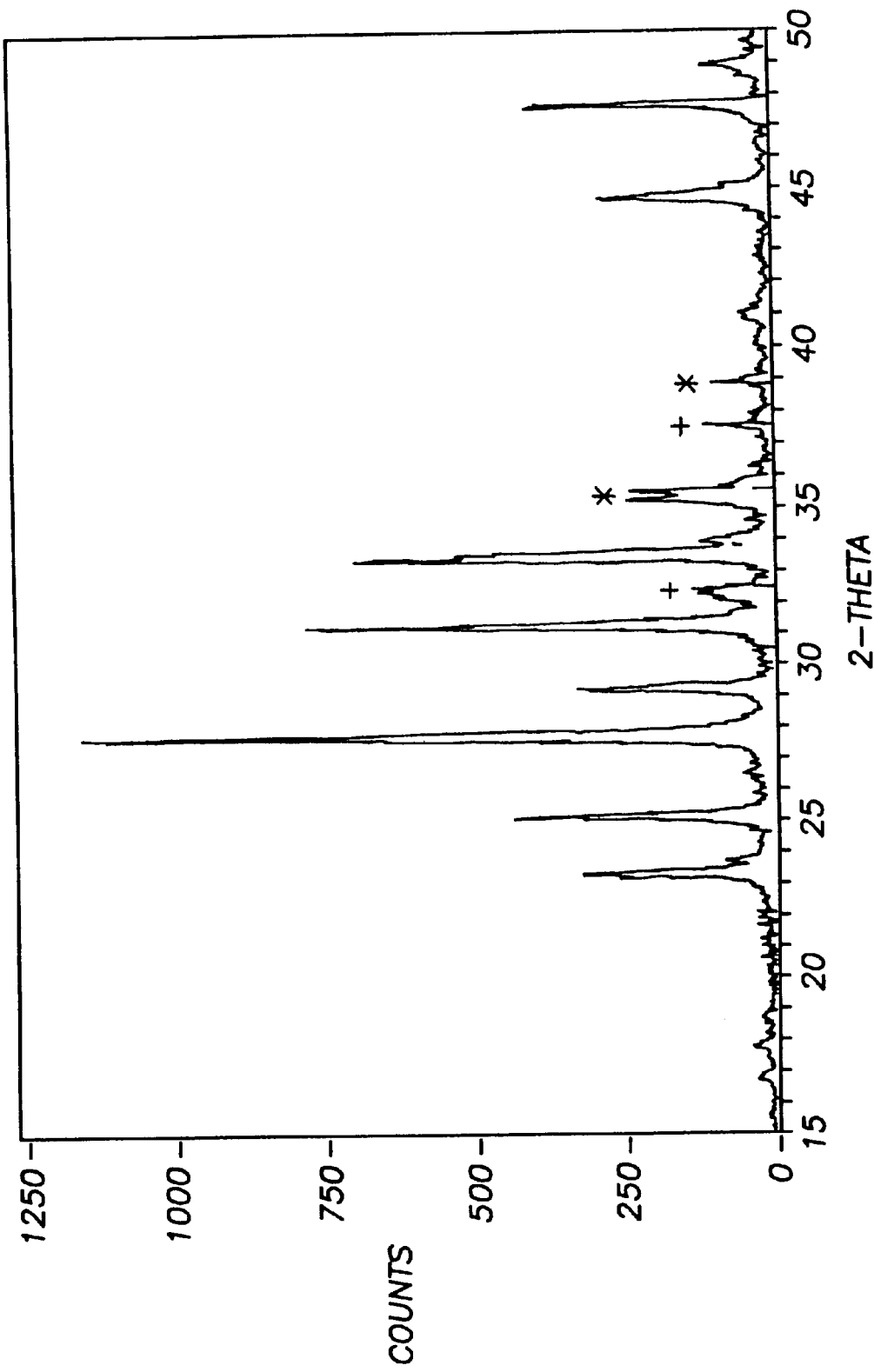
FIG. 5 depicts the x-ray diffraction (XRD) pattern of the powder prepared according to Example 1, having an orthorhombic BSCCO-2212 phase and secondary CaO and CuO peaks.

The following examples further disclose the invention and enable practice thereof:

Example 1. In the precursor powder formation stage, a homogenous mixture of Bi, Pb, Sr, Ca and Cu nitrates with metal ratios of 1.7:0.3:1.9:2.0:3.0 was decomposed to the metal oxides by reaction at 800° C. for 7 minutes in air. The metal oxide mixture was then milled to reduce the particle size and homogenize the mixture. The milled oxide powder was then reacted in 100% $O_2$ for 6 hours at 785° C. The reacted oxide mixture was again milled to reduce the particle size. Next, the milled powder was reacted at $T_p$=780° C. for 6 hours in an $N_2$ atmosphere containing 0.001 atm $O_2$. Referring to FIG. 5, an X-ray diffraction pattern of the reacted precursor powder shows peaks corresponding to the orthorhombic (Bi,Pb)SCCO 2212 phase, and several non-superconducting phases consisting of mainly the CuO and CaO phases. CaO peaks are indicated by a "+" and CuO peaks are indicated by "*" in the XRD curve of FIG. 5. The diffraction pattern has no discernible peaks corresponding to $Ca_2PbO_4$. The orthorhombic structure of the dominant Pb2212 is indicated by the splitting of the peak at 2θ=33.3°. The precursor powder was then used in the OPIT fabrication phase to form a composite precursor for a superconducting wire.

Example 2. In the precursor powder formation stage, a homogeneous mixture of Pb, Bi, Sr, Ca and Cu oxalates with metal ratios of 1.7:0.3:1.9:2.0:3.0 was decomposed to the metal oxides by reaction at 350° C. for 20 minutes in air. The metal oxide mixture was then milled to reduce the particle size and homogenize the mixture. The milled oxide powder mixture was then reacted in 100% $O_2$ for 3 hours at 750° C. The resulting milled oxide powder mixture was reacted at $T_p$=770° C. for 3 hours in an $N_2$ atmosphere containing 0.001 atm $O_2$. X-ray diffraction data of the powder showed peaks corresponding to the orthorhombic (Bi,Pb)SCCO 2212 phase, CuO, and alkaline earth cuprate phases. The diffraction pattern exhibited no discernible peaks corresponding to $Ca_2PbO_4$. The mixture was then used as a precursor powder for fabrication of a composite precursor and conversion to a superconducting article in accordance with the OPIT process.

Figure 6:
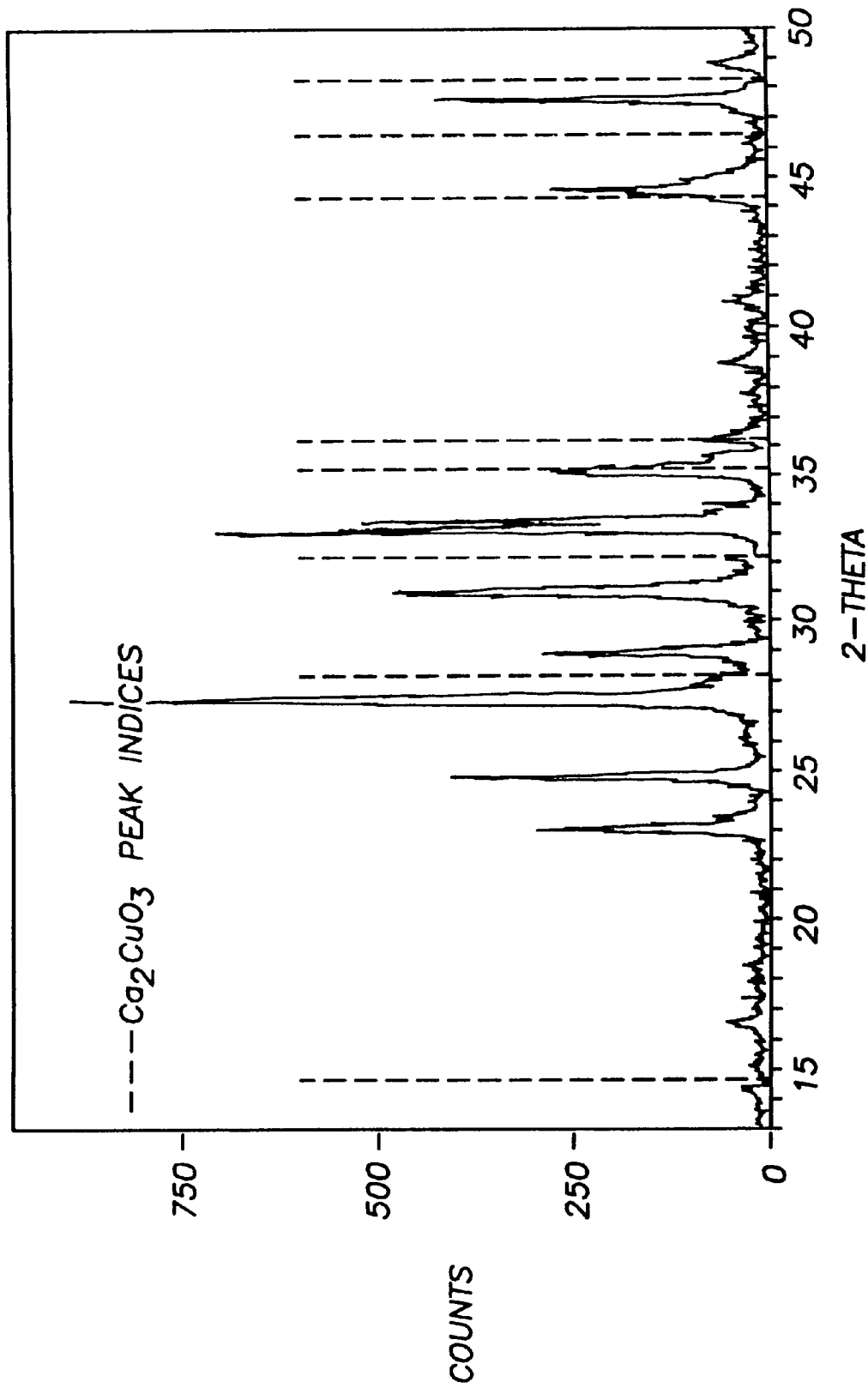
FIG. 6 depicts the x-ray diffraction (XRD) patterns of the powder prepared according to Example 3, including an orthorhombic BSCCO phase and a secondary $Ca_2CuO_3$ phase.

Example 3. In the precursor powder formation stage, a homogeneous mixture of Bi, Pb, Sr, Ca and Cu nitrates with metal ratios of 1.7:0.3:1.9:2.0:3.0 was decomposed to its metal oxides by reaction at 800° C. for 7 minutes in air. The metal oxide mixture was then milled to reduce the particle size and to homogenize the mixture. The milled oxide powder was then reacted in 100% $O_2$ for 3 hours at 750° C. The powder was then reacted at $T_p$=780° C. for 6 hours in an $N_2$ atmosphere containing <0.0001 atm $O_2$. Referring to FIG. 6, an X-ray diffraction pattern of the reacted precursor powder shows the peaks due to the orthorhombic (Bi,Pb) SCCO 2212 phase, $Cu_2O$, $Ca(Sr)_2CuO_3$ and possibly other phases. The diffraction pattern exhibits no discernible peaks corresponding to $Ca_2PbO_4$. The mixture was then used as a precursor powder for fabrication of a composite precursor and conversion to a superconducting article in accordance with the OPIT process.

Example 4. In the precursor powder formation phase, a homogenous mixture of Bi, Pb, Sr, Ca and Cu oxides with metal ratios of 1.7:0.3:1.9:2.0:3.0 was reacted at 800° C. for 6 hours in 100% $O_2$ atmosphere. The metal oxide mixture was then milled to reduce the particle size and to homogenize the mixture. The resulting powder was reacted at $T_p$=750° C. for 2 hours in an $N_2$ atmosphere containing 0.1% $O_2$. The X-ray diffraction pattern of the reacted precursor powder shows the peaks due to the orthorhombic (Bi, Pb)SCCO 2212 phase, and the alkaline earth cuprate phases including a $Ca(Sr)_{0.838}CuO_{1.83+x}$ phase. The diffraction pattern exhibits no discernible peaks due to $Ca_2PbO_4$. The mixture was then used as a precursor powder for a powder-in-tube (PIT) process.

Example 5. A homogeneous precursor alloy powder containing Pb, Bi, Sr, Ca, and Ag was prepared by mechanical alloying with the appropriate stoichiometry to form Bi-2223. The powder was packed into a silver tube along with sufficient copper metal powder or wires to form the Bi-2223 superconductor. The composite was then worked by multiple extrusion steps into a multifilamentary silver precursor metal composite tape that was typically 0.03"×0.15" in cross-section, and that contained between 200 and 100,000 filaments. The reactive elements comprising each filament was then oxidized to form unitary and binary oxide phase such as CaO, CuO, $Bi_2O_3$, PbO and SrO by diffusing oxygen through the silver matrix at conditions (typically at temperature of ~400° C.) that inhibit reaction element diffusion through the silver. After oxidation, the internal oxygen activity of the composite was then reduced to ~0.001 atm equivalent by baking the tape samples for 40 hours at 400° C. in flowing 0.001 atm balance nitrogen (to 1 atm total pressure) gas. The desired orthorhombic Bi-2212 precursor phase to Bi-2223 was then formed by baking the samples at 780° C. for 1 hour in 0.001 atm oxygen-balance argon (to 1 atm total) followed by rolling deformation. The bake and deformation was repeated up to 6 times. The sample was then used as a precursor composite for the powder-in-tube process.

Example 6. A precursor powder was prepared as described in Example 1 through 4 and packed into silver sheaths with an inner diameter of 0.625"(1.5875 cm), a length of 5.5" (13.97 cm) and a wall thickness of 0.150"(0.38 cm) to form a billet. The billet is extruded to a diameter of about 0.25"(0.63 cm) and then narrowed with multiple die passes. A mono-filamentary tape is fabricated by further extrusion and/or drawing the billet to a 0.072"wire, and then rolling the wire to a 0.006"×0.100"tape. A multi-filamentary tape is fabricated by multiple die passes through hexagonally shaped dies of varying sizes finishing with a 0.070"(0.178 cm) hexagonally shaped die to form a silver-(Bi, Pb)SCCO hexagonal wire. Several of the hexagonal wires are bundled together and drawn through a 0.070"(0.178 cm) round die to form a multi-filamentary round wire. The round wire is rolled to form a multifilamentary silver-Bi,Pb)SCCO tape of 0.009"×0.100"(0.023 cm ×0.24 cm). The tape is subjected to iterative processes of alternating heating/annealing and mechanical deformation, as described above.

The composite tape was heated from ambient temperature to 827° C. at a rate of 10° C./min in an atmosphere containing 0.075 atm oxygen and held at that temperature for 10 hours. The tape was then cooled to ambient temperature. An identical tape was heated to 400° C. at a rate of 5° C./min and to 827° C. at a rate of 1° C./min in an atmosphere containing 0.075 atm $_2$ and held at that temperature for 10 hours. Finally a composite tape containing a tetragonal 2212 precursor phase and $Ca_2PbO_4$ was fabricated and heated to 400° C. at a rate of 5° C./min and to 827° C. at a rate of 1° C./min in an atmosphere containing 0.075 atm $O_2$ and held at that temperature for 10 hours.

Figure 7:
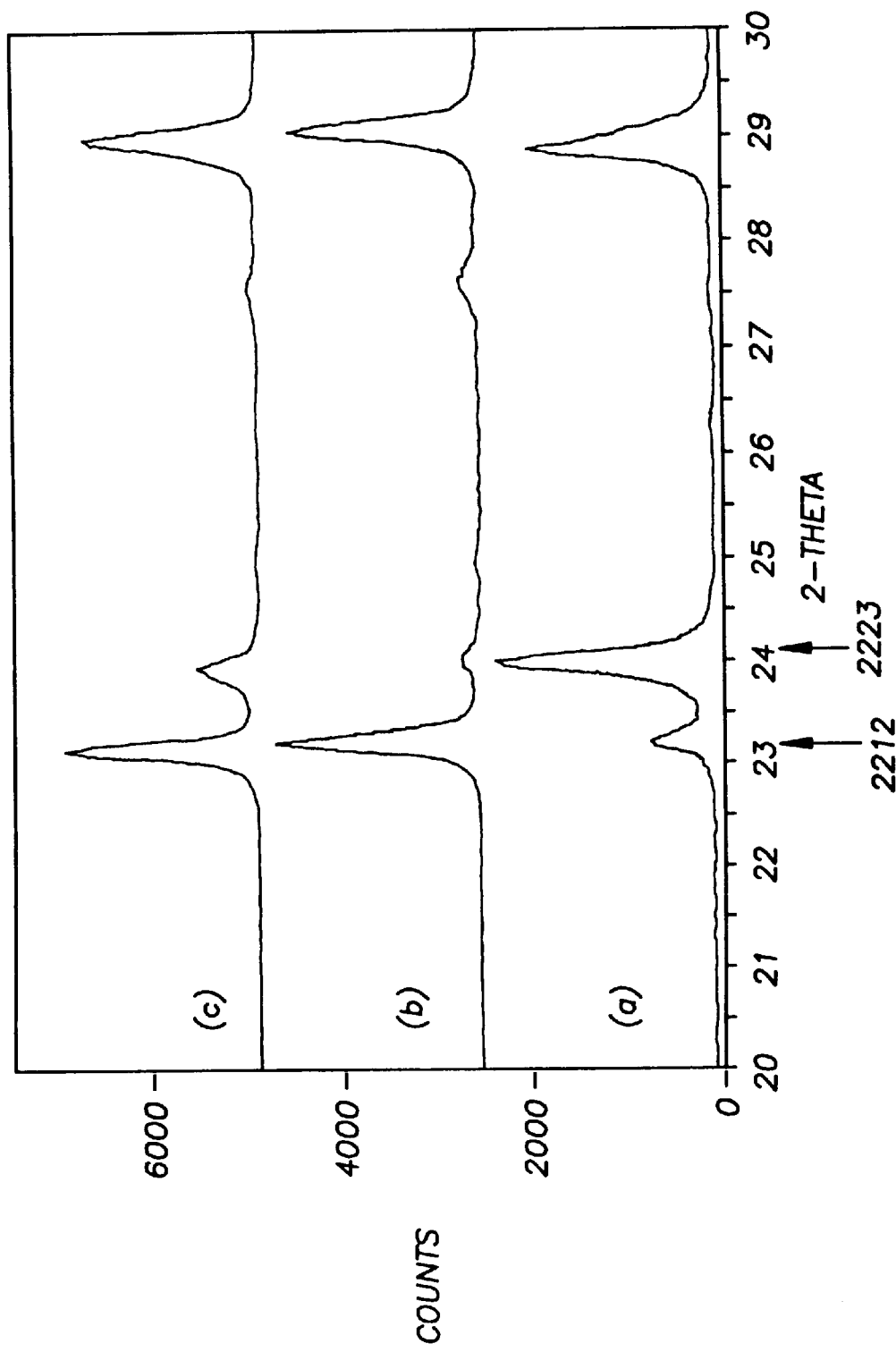
FIG. 7 depicts the x-ray diffraction (XRD) patterns indicating conversion of precursor (Bi,Pb)SCCO 2212 into the final (Bi,Pb)SCCO 2223 phase in composite tapes where the tape was (a) ramped to the reaction temperature at a rate of 10° C./min and the tapes of (b) and (c) were ramped to the reaction temperature at a rate of 1° C./min.

Referring to FIG. 7(a), the x-ray diffraction spectrum of the tape containing the orthorhombic 2212 as the dominant precursor phase and heated at the 10° C./min shows a conversion of ~80% of the dominant Pb2212 phase of the initial precursor powder to the final Pb2223 phase.

In contrast of FIG. 7(b), the x-ray diffraction spectrum of the tape containing the orthorhombic 2212 as the dominant precursor phase and heated at 1° C./min shows a conversion of ~6% of the dominant Pb2212 phase of the initial precursor powder to the final Pb2223 phase. The lower conversion rate was the result of the formation of $Ca_2PbO_4$ and the decomposition of the dominant orthorhombic 2212 during the slow temperature ramp in the temperature and oxygen partial range defined by FIG. 1.

In FIG. 7(c), the x-ray diffraction spectrum of the tape containing the tetragonal 2212 and $Ca_2PbO_4$ in the precursor phase and heated at 1° C./min shows a conversion of ~20% of the 2212 phase of the initial precursor powder to the final Pb2223 phase.

The lower conversion rates in FIGS. 7(c) and 7(b) are the result of the need to form (in 7(c)) or reform (in 7(b)) the orthorhombic Pb2212 phase at the reaction temperature before conversion of Pb2212 to Pb2223 can occur.

Example 7. The composite tape was prepared as described in Example VI using a precursor powder prepared as described in Examples 1–4. The composite tape was heated from ambient temperature to a 790° C. at a rate of 1° C./min in an atmosphere containing 0.001 atm $O_2$, then at a rate of 1° C./min to 815° C. in an atmosphere containing 0.075 atm $O_2$ and held at that temperature for 24 hours. The tape is then cooled to ambient temperature. The temperatures and oxygen partial pressures are selected to insure that $Ca_2PbO_4$ did not form in the powder during the heating step to the reaction temperature. The x-ray diffraction of the composite tape showed conversion of >50% of the original dominant orthorhombic 2212 phase to the final 2223 phase.

Example 8. In the precursor powder formation stage, a homogenous mixture of Bi, Sb, Sr, Ca and Cu nitrates with metal ratios of 1.7:0.3:1.9:2.0:3.0 was decomposed to the metal oxides by reaction at 800° C. for 7 minutes in air. The milled oxide powder was then reacted in 100% $O_2$ for 6 hours at 785° C. The reacted oxide mixture was again milled to reduce the particle size. Next, the milled powder was reacted at $T_p$=780° C. for 6 hours in an $N_2$ atmosphere containing 0.001 atm $O_2$. The resulting precursor mixture contains only the dominant orthorhombic 2212 phase and several non superconducting phases consisting predominantly of alkaline earth cuprates. The orthorhombic structure of the dominant Pb2212 is indicated by the splitting of the peak at 2θ=33.3°. The precursor powder was then used in the OPIT fabrication process to form a composite precursor for a superconducting wire.

Example 9. A mixture of Bi, Pb, Sr, Ca, and Cu nitrates with metal ratios of 1.7:0.3:1.9:2.0:3.1 was calcined at 800° C. for 18 hrs, and then ground to reduce the particle size of the oxide powder. The oxide powder then was heat treated at 780° C. for 6 hrs in pure $O_2$. At this stage, the XRD pattern indicates that the powder contains tetragonal BSCCO 2212, $Ca_2PbO_4$, alkaline earth cuprates and CuO phases.

The powder was divided into two portions. The first portion contained the tetragonal BSCCO 2212, $Ca_2PbO_4$, and CuO phases. The second portion was reacted further at 760° C. for two hours in an $N_2$ atmosphere containing 0.001 atmosphere $O_2$. XRD showed that the second powder portion was converted to orthorhombic BSCCO 2212, CaO, and CuO phases. Each powder portion was packed into an individual silver billet of 0.625"OD ×0.315"ID. Each loaded billet was extruded and then drawn into round monofilamentary wires of 0.0287". Thereafter, the round wires were rolled into 0.004"tapes.

Figure 8:
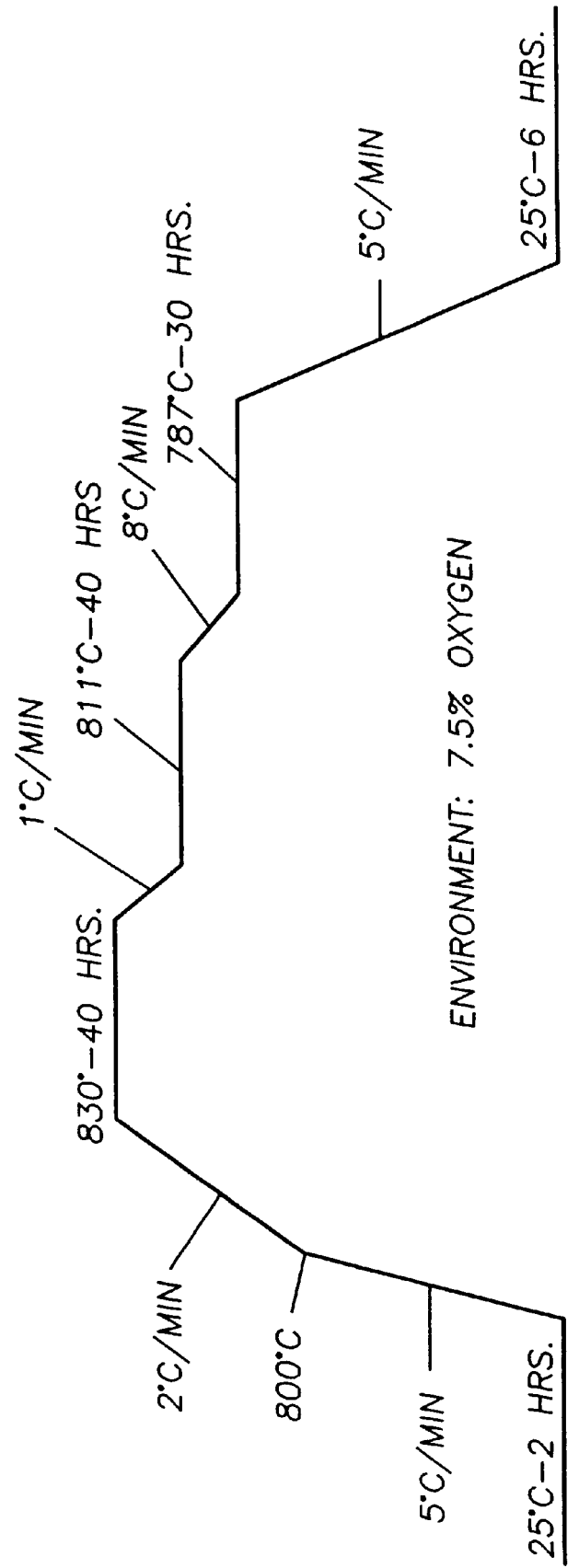
FIG. 8 is a reaction profile of a three-step heat treatment for use in the final heat treatment of the present invention.

Both of the tapes were processed into the final oxide superconductor using a thermomechanical procedure with intermediate pressing deformation. It may be desirable to use a preliminary heating step at low temperature and low $P_{O2}$ to avoid decomposition of the orthorhombic BSCCO phase into calcium plumbate and the tetragonal BSCCO phase (for example, 650–795° C. at 0.0001–0.075 atm $O_2$). See, pp 22–23 supra. The process for these tapes further included sintering the tapes at 822° C. for 48 hrs in an $N_2$ atmosphere containing 0.075 atmosphere $O_2$; pressing or rolling the tapes with 10% reduction; repeating the above sintering operation; pressing or rolling the tapes again with 10% reduction; and finally heat treating according to the heat treatment profile shown in FIG. 8. Generally, a preferred temperature range for the first step in the heat treatment profile is in the range of about 810–850° C.; a preferred temperature range for the second step is in the range of about 800–840° C.; and a preferred temperature for the third step is in the range of about 730–800° C. For pressed samples, the tapes originally containing tetragonal BSCCO 2212 have $J_c$ of only 20,000 A/cm$^2$, as compared to the $J_c$ value of 36,000 A/cm$^2$ for the tapes originally containing orthorhombic BSCCO 2212. Interestingly, rolling these monofilamentary tapes results in lower $J_c$, e.g. 15,000 A/cm$^2$ for the tapes having tetragonal BSCCO 2212 phase, and 25,000 A/cm$^2$ for the tapes having orthorhombic BSCCO 2212.

Example 10. A mixture of Bi, Pb, Sr, Ca, and Cu nitrates with metal ratios of 1.7:0.3:1.9:2.0:3.1 was calcined at 800° C. for 18 hrs, and then ground to reduce the particle size of the oxide powder. The oxide powder was also heat treated at 780° C. for 6 hrs in pure $O_2$. At this stage, the powder contains tetragonal BSCCO 2212, $Ca_2PbO_4$, alkaline earth cuprates and CuO phases.

The powder was packed into a pure silver billet of 1.25"OD ×1.01"ID. The loaded billet was extruded and then drawn into a hexagonal monofilament wire of 0.055". This hexagonal monofilament wire was cut into 85 equal length pieces and bundled into a 0.76"×0.6" pure silver tube. Thereafter, the bundled 85 filament tube was drawn down to a round wire of 0.0354".

The 0.0354" round wire was cut into two half. One 85-filament wire contained tetragonal BSCCO 2212, while the other was converted into an orthorhombic BSCCO 2212. In order to convert the tetragonal BSCCO 2212 into orthorhombic BSCCO 2212 phase in the wire, one half of the wire was annealed at 760° C. for two hours in an $N_2$ atmosphere containing 0.001 atmosphere $O_2$. The other half of the wire with tetragonal 2212 was annealed at 300° C. for 0.5 hr for releasing the strain on silver. Both wires were rolled into a 0.006" thick tapes, following by a thermomechanical process with intermediate rolling deformation. It may be desirable to use a preliminary heating step at low temperature and low $P_{O2}$ to avoid decomposition of the orthorhombic BSCCO phase into calcium plumbate and the tetragonal BSCCO phase (for example, 650–795° C. at 0.0001–0.075 atm $O_2$). See, pp 22–23 supra. The process for these tapes further included sintering the tapes at 822° C. for 12 hrs in an $N_2$ atmosphere containing 0.075 atmosphere $O_2$; rolling or pressing the tapes with 20% reduction; and finally heat treating using the profile in FIG. 8. Generally, a preferred temperature range for the first step in the heat treatment profile is in the range of about 810–850° C.; a preferred temperature range for the second step is in the range of about 800–840° C.; and a preferred temperature for the third step is in the range of about 730–800° C. For the tapes containing tetragonal BSCCO 2212 phase, the $J_c$ value is only 23,000 A/cm$^2$, as compared to a $J_c$ of 36,000 A/cm$^2$ for the tapes containing orthorhombic BSCCO 2212 phase.

Other embodiments of the invention will be apparent to those skilled in the art from a consideration of this specification or practice of the invention disclosed herein. It is intended that the specification, examples and the accompanying drawings shall be interpreted as illustrative and not in a limiting sense, with the true scope and spirit of the invention being indicated by the following claims.

What is claimed is:

1. A method of manufacture of an elongated BSCCO superconducting article, comprising the steps of:

heating a mixture of raw materials comprising constituent metallic elements corresponding to a final superconducting BSCCO material at a first selected processing temperature in an atmosphere with a first selected oxygen partial pressure for a first selected time period, thereby converting the mixture of raw materials into a mixture containing a dominant amount of a tetragonal BSCCO phase;

forming a composite article comprised of the mixture with a dominant amount of tetragonal BSCCO phase substantially surrounded by a constraining metal and subjecting the composite article to a non-texturing deformation thereby reducing or altering the cross-sectional area of said composite article and thereby producing a deformed composite article;

heating the deformed composite article at a second selecting processing temperature in an atmosphere with a second selected oxygen partial pressure for a second selected time period, thereby converting the tetragonal BSCCO phase into an orthorhombic BSCCO phase and thereby producing an orthorhombic BSCCO-phase-containing article;

performing texture-inducing asymmetric deformation on the orthorhombic BSCCO-phase-containing article, thereby forming a textured article; and heating said textured article at a third selected processing temperature in an atmosphere with a third selected oxygen partial pressure for a third selected time period, thereby converting at least a portion of said orthorhombic BSCCO phase to superconducting BSCCO material.

2. A method of manufacture of an elongated BSCCO superconducting article, comprising the steps of:

subjecting a composite article comprised of a precursor oxide comprising a dominant amount of a tetragonal BSCCO phase substantially surrounded by a constraining metal to a non-texturing deformation thereby reducing or altering the cross-sectional area of said composite article;

heating the deformed composite article at a first selected processing temperature in an atmosphere with a first selected oxygen partial pressure for a first selected time period, thereby converting the tetragonal BSCCO phase into an orthorhombic BSCCO phase thereby producing an orthrhombic BSCCO-phase-containing article;

performing a texture-inducing asymmetric deformation on the orthorhombic BSCCO-phase-containing composite article, thereby forming a textured article; and heating said textured article at a second selected processing temperature in an atmosphere with a second selected oxygen partial pressure for a second selected time period, thereby converting at least a portion of said orthorhombic BSCCO phase to superconducting BSCCO material.

3. The method of claim 1 or 2, wherein the texture-inducing asymmetric deformation is selected from the group consisting of rolling, pressing and isostatic pressing.

4. The method of claim 1 or 2, wherein said superconducting BSCCO material comprises (Bi,Pb)SCCO 2223, said tetragonal BSCCO phase comprises tetragonal (Bi,Pb)SCCO 2212 and said orthorhombic BSCCO phase comprises orthorhombic (Bi,Pb)SCCO 2212.

5. The method of claim 1 or 2, wherein said superconducting BSCCO material comprises BSCCO 2223, said tetragonal BSCCO phase comprises tetragonal BSCCO 2212 and said orthorhombic BSCCO phase comprises orthorhombic BSCCO 2212.

6. The method of claim 1, wherein said step of heating the deformed article also converts the tetragonal BSCCO phase into an alkaline earth cuprate phase.

7. The method of claim 2, wherein said step of heating the deformed article also converts the tetragonal BSCCO phase into an alkaline earth cuprate phase.

8. The method of claim 1 or 2, wherein the non-texturing deformation comprises one of extruding and drawing.

9. The method of claim 8, wherein said forming step includes bundling a plurality of articles each comprised of the mixture with a dominant amount of tetragonal BSCCO phase substantially surrounded by a constraining metal.

10. The method of claim 1 or 2, further comprising the step of sequentially repeating said performing step and said step of heating said textured article.

11. The method of claim 1, wherein the first selected processing temperature is in the range of between 700 and 850° C., and the first selected oxygen partial pressure is in the range of $10^{-5}$–0.04 atm.

12. The method of claim 1, wherein the second selected processing temperature is in the range of 650–795° C., and the second selected oxygen partial pressure is in the range of $10^{-5}$–0.04 atm.

13. The method of claim 2, wherein the first selected processing temperature is in the range of 650–795° C., and the first selected oxygen partial pressure is in the range of $10^{-5}$–0.04 atm.

14. The method of claim 1, wherein the third processing temperature and the third oxygen partial pressure are such that a Ca—Pb—O phase is not formed and the orthorhombic BSCCO phase does not decompose, during said step of heating said textured article.

15. The method of claim 2, wherein the second processing temperature and the second oxygen partial pressure are such that a Ca—Pb—O phase is not formed and the orthorhombic BSCCO phase does not decompose, during said step of heating said textured article.

16. The method of claim 1, wherein the third processing temperature is in the range of 800–845° C., and the third selected oxygen partial pressure is in the range of 0.003–0.21 atm.

17. The method of claim 2, wherein the second processing temperature is in the range of 800–845° C., and the second selected oxygen partial pressure is in the range of 0.003°0.21 atm.

18. The method of claim 1, wherein the third processing temperature is initially in the range of 810–850° C., then in the range of 800–840° C., and finally in the range of 730–800° C., and wherein the third selected oxygen partial pressure is in the range of 0.003–0.21 atm.

19. The method of claim 2, wherein the second processing temperature is initially in the range of 810–850° C., then in the range of 800–840° C., and finally in the range of 730–800° C., and wherein the second selected oxygen partial pressure is in the range of 0.003—and 0.21 atm.

20. The method of claim 1, wherein the third processing temperature is initially in the range of 650–795° C. while the third selected oxygen partial pressure is in the range of 0.0001–0.075 atm, and then the third processing temperature is in the range of 800–840° C. while the third selected oxygen partial pressure is in the range of 0.003–0.21 atm.

21. The method of claim 2, wherein the second processing temperature is initially in the range of 650–795° C. while the third selected oxygen partial pressure is in the range of 0.0001–0.075 atm, and then the second processing temperature is in the range of 800–840° C. while the second selected oxygen partial pressure is in the range of 0.003–0.21 atm.

22. The method of claim 1, wherein the third selected processing temperature is initially in the range of 650–795° C. while the third selected oxygen partial pressure is in the range of 0.0001–0.075 atm, then is in the range of 810–850° C. while the third selected oxygen partial pressure is in the range of 0.003–0.21 atm, then is in the range of 800–840° C. while the third oxygen partial pressure is in the range of 0.003–0.21 atm, and finally is in the range of 730–800° C. while the third oxygen partial pressure is in the range of 0.003–0.21 atm.

23. The method of claim 2, wherein the second selected processing temperature is initially in the range of 650–795° C. while the second selected oxygen partial pressure is in the range of 0.0001–0.075 atm, then is in the range of 810–850° C. while the second selected oxygen partial pressure is in the range of 0.0030.21 atm, then is in the range of 800–840° C. while the second selected oxygen partial pressure is in the range of 0.003–0.21 atm, and finally is in the range of 730–800° C. while the second oxygen partial pressure is in the range of 0.003–0.21 atm.

24. The method of claim 1 or 2, wherein the step of heating said textured article includes heating said textured article at a rate through a temperature range and oxygen partial pressure range at which a Ca—Pb—O phase would form and the orthorhombic BSCCO phase would decompose if the rate was below a certain level, and further wherein the rate is above the certain level such that a Ca—Pb—O phase does not form and the orthorhombic BSCCO phase does not decompose during the heating of the textured article through the temperature range and the oxygen partial pressure range.

25. The method of claim 24, wherein said ramp rate is greater than 0.1° C./min.

26. The method of claim 24, wherein said ramp rate is in the range of 0.1 to 100° C./min.

* * * * *

UNITED STATES PATENT AND TRADEMARK OFFICE
CERTIFICATE OF CORRECTION

PATENT NO. : 5,942,466
DATED : August 24, 1999
INVENTOR(S) : Qi Li, Eric R. Podtburg, Patrick John Walsh, William L. Carter, Gilbert N. Riley, Jr., Martin W. Rupich, Elliott Thompson, Alexander Otto It is certified that error appears in the above-identified patent and that said Letters Patent is hereby corrected as shown below:

Column 1,
Line 36, replace "forming powder" with -- forming a powder --,
Line 37, replace "tage" with -- stage --, Column 3,
Line 3, replace "elected" with -- selected --,
Line 4, replace "he" with -- the --,
Line 7, replace "erein" with -- herein --, Column 7,
Line 43, replace "81-850°C" with -- 810-850°C --, Column 8,
Line 44, replace "IC" with -- $I_c$ --,
Line 47, replace "predomin" with -- predominant --, Column 10,
Line 48, replace "bove" with -- above --,
Line 49, replace "eduction" with -- reduction --, Column 11,
Line 27, replace "330(2θ)" with -- 33°(2θ) --, Column 18,
Line 30, replace "$_2$" with -- $O_2$ --, Column 20,
Line 66, replace "selecting" with -- selected --

Column 22,
Line 2, replace "$10^{-5}$-0.04 atm" with -- 0.04-1 atm --,
Line 27, replace "0.003°0.21 atm" with -- 0.003-0.21 atm --,
Line 38, replace "0.003-and 0.21 atm" with -- 0.003-0.21 atm --,
Lines 43, and 49, replace "800-840°C" with -- 800-845°C --,
Line 66, replace "0.0030.21 atm" with -- 0.003-0.21 atm --,

UNITED STATES PATENT AND TRADEMARK OFFICE
CERTIFICATE OF CORRECTION

PATENT NO. : 5,942,466
DATED : August 24, 1999
INVENTOR(S) : Qi Li, Eric R. Podtburg, Patrick John Walsh, William L. Carter, Gilbert N. Riley, Jr., Martin W. Rupich, Elliott Thompson, Alexander Otto It is certified that error appears in the above-identified patent and that said Letters Patent is hereby corrected as shown below:

Column 24,
Line 5, replace "said ramp rate" with -- said rate --,
Line 7, replace "said ramp rate" with -- said rate --.

Signed and Sealed this

Second Day of October, 2001

Attest:

NICHOLAS P. GODICI
*Attesting Officer*  *Acting Director of the United States Patent and Trademark Office*